US00RE50457E

(19) United States
(12) Reissued Patent
Tateshita

(10) Patent Number: US RE50,457 E
(45) Date of Reissued Patent: Jun. 10, 2025

(54) SEMICONDUCTOR DEVICE AND SEMICONDUCTOR DEVICE MANUFACTURING METHOD

(71) Applicant: Sony Group Corporation, Tokyo (JP)

(72) Inventor: Yasushi Tateshita, Kanagawa (JP)

(73) Assignee: Sony Group Corporation, Tokyo (JP)

(21) Appl. No.: 16/196,919

(22) Filed: Nov. 20, 2018

Related U.S. Patent Documents

Reissue of:

(64) Patent No.: 8,049,286
Issued: Nov. 1, 2011
Appl. No.: 12/115,931
Filed: May 6, 2008

(30) Foreign Application Priority Data

May 9, 2007 (JP) ..... 2007-124264

(51) Int. Cl.
*H01L 29/76* (2006.01)
*H01L 21/28* (2006.01)
(Continued)

(52) U.S. Cl.
CPC ..... *H10D 30/795* (2025.01); *H01L 21/28123* (2013.01); *H10D 30/0273* (2025.01);
(Continued)

(58) Field of Classification Search
CPC ..... H01L 29/6653; H01L 29/66606; H01L 29/7851; H01L 29/7848; H01L 29/7853;
(Continued)

(56) References Cited

U.S. PATENT DOCUMENTS 6,720,619 B1 * 4/2004 Chen ..... H01L 29/7854 257/623
6,867,433 B2 * 3/2005 Yeo ..... H01L 21/84 257/350
(Continued)

FOREIGN PATENT DOCUMENTS

CN 1841739 10/2006
CN 1881586 12/2006
(Continued)

OTHER PUBLICATIONS

Japanese Office Action issued on Jun. 2, 2009 in connection with JP Application No. 2007-124264.
(Continued)

*Primary Examiner* — Leonardo Andujar
(74) *Attorney, Agent, or Firm* — Michael Best & Friedrich LLP

(57) ABSTRACT

In the present invention, there is provided a semiconductor device including: element isolation regions formed in a state of being buried in a semiconductor substrate such that an element formation region of the semiconductor substrate is interposed between the element isolation regions; a gate electrode formed on the element formation region with an gate insulating film interposed between the gate electrode and the element formation region, the gate electrode being formed so as to cross the element formation region; and source-drain regions formed in the element formation region on both sides of the gate electrode, wherein a channel region made of the element formation region under the gate electrode is formed so as to project from the element isolation
(Continued)

regions, and the source-drain regions are formed to a position deeper than surfaces of the element isolation regions.

11 Claims, 21 Drawing Sheets

(51) Int. Cl.

| | |
|---|---|
| ***H10D 30/01*** | (2025.01) |
| ***H10D 30/62*** | (2025.01) |
| ***H10D 30/69*** | (2025.01) |
| ***H10D 62/00*** | (2025.01) |
| ***H10D 64/01*** | (2025.01) |
| *H10D 30/60* | (2025.01) |

(52) U.S. Cl.
CPC ..... *H10D 30/6211* (2025.01); *H10D 30/6212* (2025.01); *H10D 30/792* (2025.01); *H10D 30/797* (2025.01); *H10D 62/021* (2025.01); *H10D 64/015* (2025.01); *H10D 64/017* (2025.01); *H01L 21/28079* (2013.01); *H01L 21/28088* (2013.01); *H01L 21/28194* (2013.01); *H10D 30/601* (2025.01)

(58) Field of Classification Search
CPC ..... H01L 29/6654; H01L 29/7846; H01L 29/66636; H01L 29/7843; H01L 21/28194; H01L 21/28088; H01L 21/28097; H01L 21/28123
USPC ..... 257/401, 396, 547
See application file for complete search history.

(56) References Cited

U.S. PATENT DOCUMENTS

| | | | | |
|---|---|---|---|---|
| 7,442,995 | B2 | 10/2008 | Tanabe | |
| 7,538,386 | B2 * | 5/2009 | Jang | H01L 21/823437 257/327 |
| 7,592,675 | B2 * | 9/2009 | Liaw | H01L 27/11 257/371 |
| 2005/0051867 | A1 * | 3/2005 | Lee | H01L 27/11 257/510 |
| 2005/0239252 | A1 * | 10/2005 | Ahn | H01L 21/823462 257/E21.429 |
| 2006/0157797 | A1 | 7/2006 | Tateshita | |
| 2006/0160342 | A1 | 7/2006 | Doczy | |
| 2006/0223290 | A1 | 10/2006 | Belyansky | |
| 2006/0278952 | A1 | 12/2006 | Mori | |
| 2007/0069254 | A1 * | 3/2007 | Cho | H01L 29/785 257/288 |
| 2007/0069293 | A1 * | 3/2007 | Kavalieros | H01L 21/823431 438/153 |
| 2007/0134878 | A1 * | 6/2007 | Brask | H01L 29/7851 438/294 |

FOREIGN PATENT DOCUMENTS

| | | | |
|---|---|---|---|
| CN | 1881586 | A | 12/2006 |
| DE | 102005022306 | A1 | 12/2022 |
| JP | 2000-315789 | | 11/2000 |
| JP | 2002-118255 | | 4/2002 |
| JP | 2002-151688 | | 5/2002 |
| JP | 2002-198532 | | 7/2002 |
| JP | 2002-198532 | A | 7/2002 |
| JP | 2005-333136 | | 2/2005 |
| JP | 2005-33136 | | 12/2005 |
| JP | 2006-012924 | | 1/2006 |
| JP | 2006012924 | A | 1/2006 |
| JP | 2006-278754 | | 10/2006 |
| JP | 2006-313869 | | 11/2006 |
| KR | 10-2006-0134772 | A | 12/2006 |
| KR | 10-2007-0039384 | A | 4/2007 |

OTHER PUBLICATIONS

Japanese Office Action issued on Jun. 15, 2010 in connection with counterpart JP Application No. 2007-124264.
Chinese Office Action issued on Dec. 21, 2010 corresponding to counterpart Chinese Patent Application No. 2008-10095289.4.

* cited by examiner

SEMICONDUCTOR DEVICE AND SEMICONDUCTOR DEVICE MANUFACTURING METHOD

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

CROSS REFERENCES TO RELATED APPLICATIONS

*This application is a Reissue Application of Ser. No. 12/115,931, filed May 6, 2008, now U.S. Pat. No. 8,049,286, issued Nov. 1, 2011.* The present invention contains subject matter related to Japanese Patent Application JP 2007-124264 filed in the Japan Patent Office on May 9, 2007, the entire contents of which being incorporated herein by reference.

BACKGROUND OF THE INVENTION

1. Field of the Invention

The present invention relates to a semiconductor device in which stress is applied to a channel region, and a method of manufacturing the semiconductor device.

2. Description of the Related Art

Many reports on techniques for improving driving capability without depending on a scaling law have recently been given. The known techniques enhance driving capability by applying stress to a silicon region (for example a silicon substrate) in which a channel region is formed, and thereby increasing mobility of electrons and holes. As these techniques, a method has been put to practical use in which method a drain-source part is dug down by silicon etching, and a silicon compound having a different lattice constant from that of silicon (Si) is grown by an epitaxial growth method, whereby stress is applied to a channel (see Japanese Patent Laid-Open No. 2000-315789, for example).

In addition, various attempts have been made, including stress liner techniques that distort a channel by forming a covering of a silicon nitride film having stress after formation of the transistor, techniques that distort a channel by using a film having stress as a part of burying materials for STI (Shallow Trench Isolation), and the like.

The mechanism will be described with reference to a schematic diagram. FIGS. 10A and 10B show the three-dimensional directions of stresses most effective when applied to the respective transistors of a pMOSFET shown in FIG. 10A and an nMOSFET shown in FIG. 10B to distort a channel. Effective stress common to the NMOS and the PMOS is applied in a direction of stretching an active region in an x-direction.

A section in a gate width direction (a direction orthogonal to a source-to-drain region direction) of a two-dimensional type (planar) MOS transistor in related art will be described with reference to a schematic configuration sectional view of FIG. 11. It is known that as shown in FIG. 11, an insulating film (high density plasma (HDP) or the like) when buried in a trench 115 formed in a semiconductor substrate 111 to form an element isolation regions 113 of an STI structure has compressive stress. The stress applied to a channel region 114 of the transistor acts in a direction of degrading mobility (the direction of arrows).

On the other hand, as transistor generations have succeed, many researches have been conducted into transistors having a three-dimensional structure in place of the two-dimensional type (planar) transistor in related art. A typical transistor is referred to as a fin gate transistor, in which a gate electrode is disposed on a silicon substrate with a gate dielectric interposed between the gate electrode and the silicon substrate, the gate dielectric covering a channel region part of a fin part formed so as to be projected in the shape of a fin (see Japanese Patent Laid-Open No. 2006-12924, for example). In addition, a tri gate transistor using, as a channel, not only an upper side surface of a semiconductor substrate in which a trench is formed but also a side wall part of an upper side of the trench has been reported (see Japanese Patent Laid-Open No. 2002-198532, for example).

FIG. 12 is a three-dimensional schematic diagram of an ordinary MOS transistor. FIG. 13 is a vertical sectional view including a line A-A' of FIG. 12. When silicide layers 131 and 132 for lowering resistance are formed on the surfaces of source-drain regions 127 and 128 in a transistor 101 having a structure in which a channel region 114 and the source-drain regions 127 and 128 project from the surface of a semiconductor substrate 111, as shown in FIGS. 12 and 13, a leak occurs as a result of the silicide layers 131 and 132 being close to or in contact with the PN junction of the source-drain regions 127 and 128 formed by ion implantation and projected from the surface of the semiconductor substrate 111.

SUMMARY OF THE INVENTION

Problems to be solved lie in that stress applied in the gate width direction (hereinafter the gate width direction refers to a direction orthogonal to a source-to-drain region direction) of the channel region of the transistor acts in a direction of degrading mobility when the STI structure is used for the element isolation region and in that a leak occurs when the source-drain regions are formed in a state of projecting from the silicon substrate and the silicide layers are formed to lower the resistance of the source-drain regions.

It is desirable to make the stress applied in the gate width direction of the channel region act in a direction of improving mobility and prevent a leak occurring when the silicide layers are formed to lower resistance on the surfaces of the source-drain regions by improving the structure of the channel region and the element isolation region.

According to a first embodiment of the present invention, there is provided a semiconductor device including: element isolation regions formed in a state of being buried in a semiconductor substrate such that an element formation region of the semiconductor substrate is interposed between the element isolation regions; a gate electrode formed on the element formation region with an gate insulating film interposed between the gate electrode and the element formation region, the gate electrode being formed so as to cross the element formation region; and source-drain regions formed in the element formation region on both sides of the gate electrode, wherein a channel region made of the element formation region under the gate electrode is formed so as to project from the element isolation regions, and the source-drain regions are formed to a position deeper than surfaces of the element isolation regions.

In the above-described first embodiment of the present invention, the channel region made of the element formation region under the gate electrode is formed so as to project from the element isolation regions. Thus, compressive stress caused by stress applied to the channel region directly under the gate electrode from the element isolation regions in the gate width direction of the lower part of the channel region is released in the channel region, and therefore strong tensile stress acts in the gate width direction of the channel region. In addition, the source-drain regions are formed to a position deeper than the surfaces of the element isolation regions. Therefore, the junction positions of the source-drain regions are deeper than the surfaces of the element isolation regions, and even when silicide layers for lower resistance are formed on the surfaces of the source-drain regions, the silicide layers do not come close to or in contact with the semiconductor substrate at the lower part of the source-drain regions, so that the occurrence of a leak is prevented.

According to a second embodiment of the present invention, there is provided a semiconductor device manufacturing method including steps of: forming element isolation regions in a semiconductor substrate such that an element formation region is interposed between the element isolation regions and the element isolation regions are buried in the semiconductor substrate; forming a dummy gate on the element formation region such that the dummy gate crosses the element formation region; forming source-drain regions in the element formation region on both sides of the dummy gate such that junction positions of the source-drain regions are deeper than surfaces of the element isolation regions; forming a first insulating film on the semiconductor substrate with a surface of the dummy gate being exposed; forming a groove by removing the dummy gate; removing top parts of the element isolation regions within the groove; and forming a gate electrode on the semiconductor substrate within the groove with a gate insulating film interposed between the gate electrode and the semiconductor substrate.

In the above-described second embodiment of the present invention, the channel region made of the element formation region under the gate electrode is formed so as to project from the element isolation regions. Thus, compressive stress caused by stress applied to the channel region directly under the gate electrode from the element isolation regions in the gate width direction of the lower part of the channel region is released in the channel region, and therefore strong tensile stress acts in the gate width direction of the channel region. In addition, the junction positions of the source-drain regions are deeper than the surfaces of the element isolation regions. Thus, even when silicide layers for lower resistance are formed on the surfaces of the source-drain regions, the silicide layers do not come close to or in contact with the semiconductor substrate at the lower part of the source-drain regions, so that the occurrence of a leak is prevented.

The above-described first embodiment of the present invention has an advantage in that it is possible to produce stress in the channel region directly under the gate electrode in a gate length direction advantageous to a transistor characteristic (carrier mobility), and thus improve on current Ion of the transistor, so that the performance of the transistor is improved. In addition, because the junction positions of the source-drain regions are deeper than the surfaces of the element isolation regions, even when a silicide for lower resistance is formed on the surfaces of the source-drain regions, a leak of current between the silicide layers and the semiconductor substrate does not occur. The reliability of the transistor is thereby improved. The above-described effects become greater as the transistor is reduced in gate width.

The above-described second embodiment of the present invention has an advantage in that it is possible to produce stress in the channel region directly under the gate electrode in a gate width direction advantageous to a transistor characteristic (carrier mobility), and thus improve on current Ion of the transistor, so that the performance of the transistor is improved. In addition, because the junction positions of the source-drain regions are deeper than the surfaces of the element isolation regions, even when a silicide for lower resistance is formed on the surfaces of the source-drain regions, a leak of current between the silicide layers and the semiconductor substrate does not occur. The reliability of the transistor is thereby improved. The above-described effects become greater as the transistor is reduced in gate width.

DETAILED DESCRIPTION OF PREFERRED EMBODIMENTS

Figure 1:
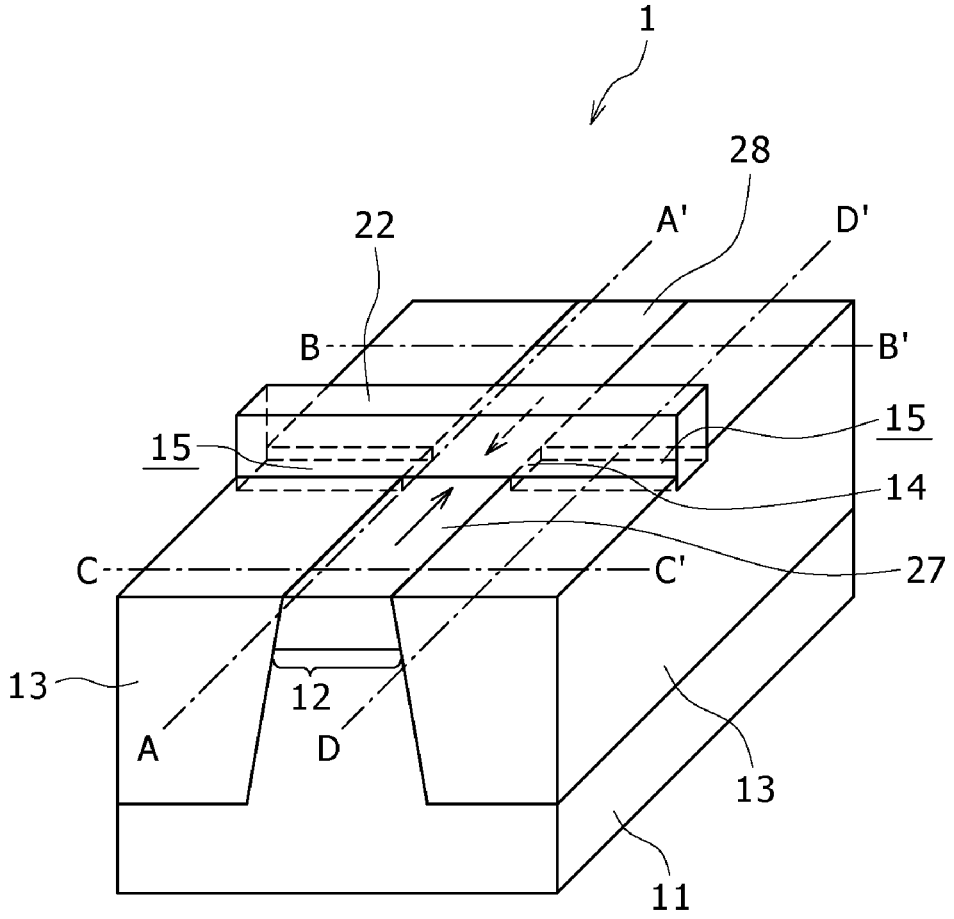
FIG. 1 is a schematic perspective view schematically showing an embodiment (first embodiment) of a semiconductor device according to the present invention.

A preferred embodiment (first embodiment) of a semiconductor device according to the present invention will be described with reference to a schematic perspective view of FIG. 1, a vertical sectional view of FIG. 2 including a line A-A', a vertical sectional view of FIG. 3 including a line B-B', a vertical sectional view of FIG. 4 including a line [C-C'] *D-D'*, and a vertical sectional view of FIG. 5 including a line [D-D'] *C-C'*. Incidentally, FIG. 1 is a diagram showing a general constitution, in which diagram a part of constituent parts are not shown. In FIGS. 3 and 5, an interlayer insulating film is not shown.

Figure 2:
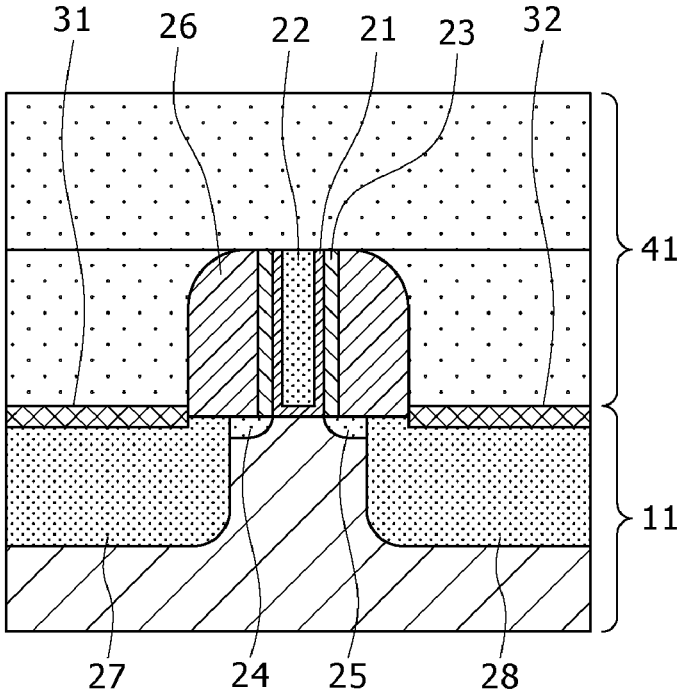
FIG. 2 is a vertical sectional view including a line A-A'.
Figure 3:
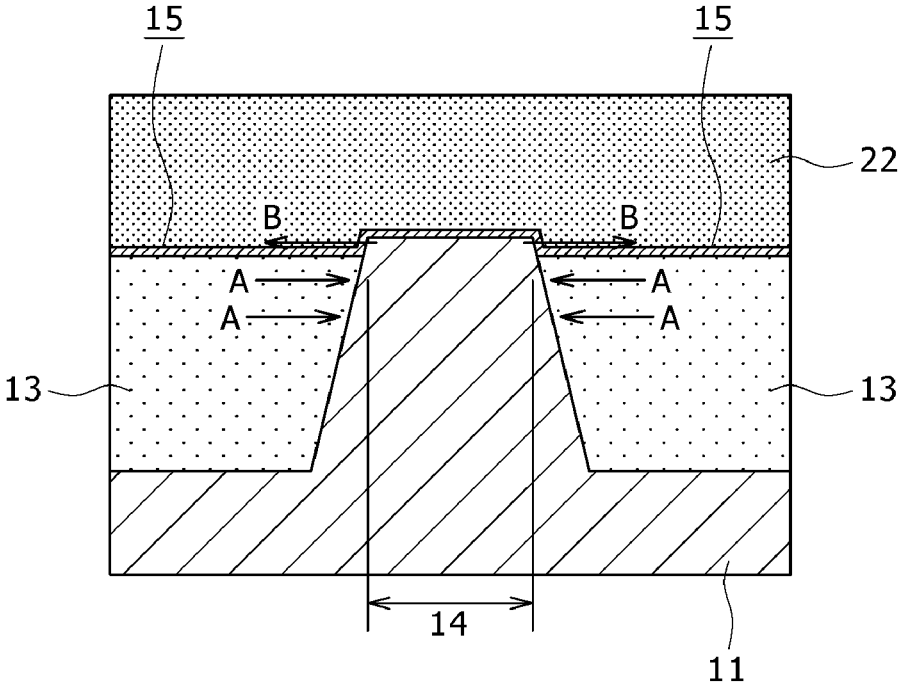
FIG. 3 is a vertical sectional view including a line B-B'.

Referring mainly to FIGS. 1 and 2, description will be made in the following of the constitution of a semiconductor device 1.

Element isolation regions 13 for electrically isolating an element formation region 12 in which a transistor is formed are formed in a semiconductor substrate 11. A silicon substrate, for example, is used as the semiconductor substrate 11, and an ordinary STI (Shallow Trench Isolation) structure is used for the element isolation regions 13. Thus, a part of the semiconductor substrate 11 which part is interposed between the element isolation regions 13 is the element formation region 12.

Figure 4:
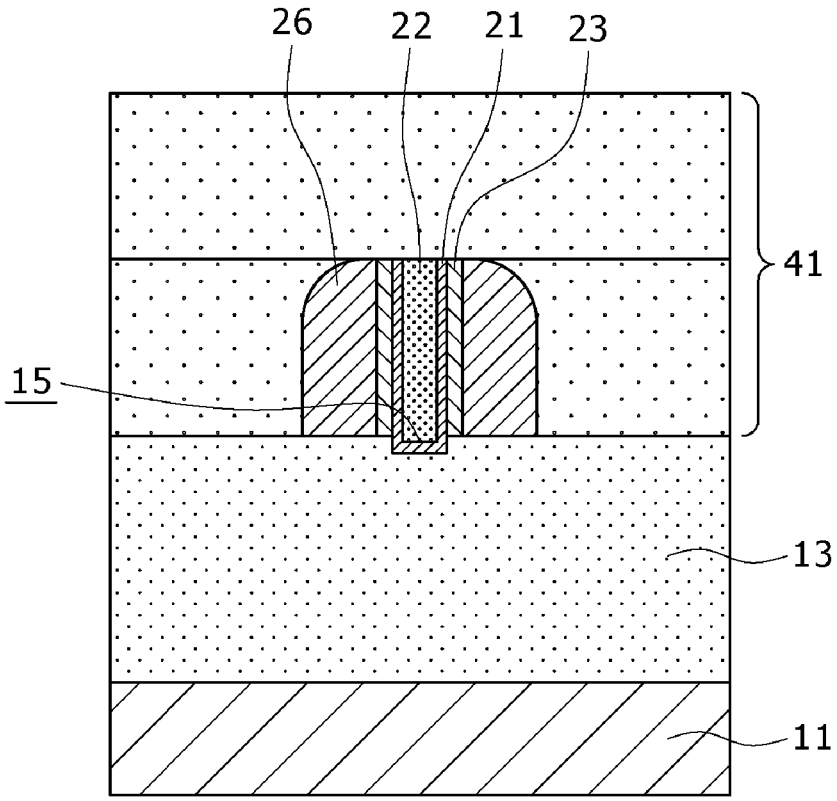
FIG. 4 is a vertical sectional view including a line [C-C'] *D-D'*.
Figure 5:
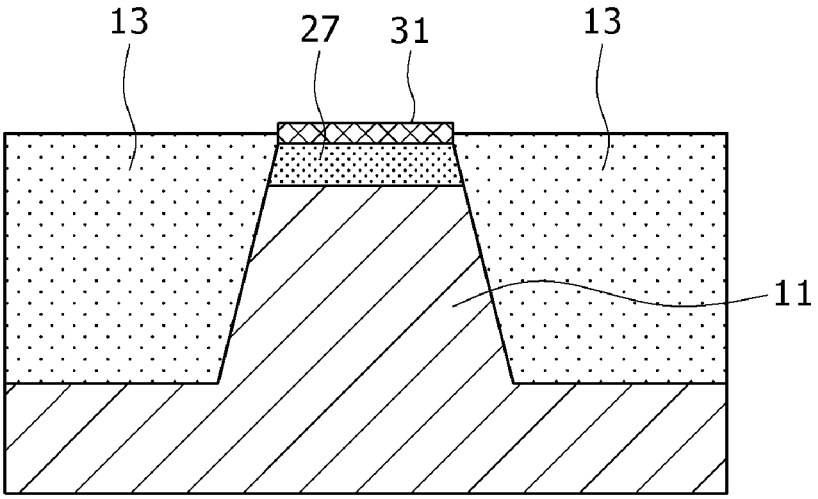
FIG. 5 is a vertical sectional view including a line [D-D'] *C-C'*.

Depressions 15 are formed in upper parts of the element isolation regions 13 formed on both sides of a channel region 14 formed in the element formation region 12 so that the channel region 14 projects from the surfaces of the element isolation regions 13 (see also the vertical sectional view of FIG. 3 including the line B-B' and the vertical sectional view of FIG. 4 including the line [C-C'] *D-D'*). Thus, the depressions 15 are formed in the element isolation regions 13 on both sides of the channel region 14 such that only the channel region 14 projects from the element isolation regions 13. In this case, an amount of projection of the channel region 14 from the surfaces of the element isolation regions 13 at the bottom of the depressions 15 is set at 3 nm to 30 nm inclusive, for example. (And channel width is set at 0.5 μm or less). An effective stress is thereby applied in a direction of gate width of the channel region 14 (X-direction). Incidentally, when the amount of projection is less than 3 nm, the channel region 14 is affected by stress in the element isolation regions 13, and thus an effect of forming the channel region 14 in a projecting manner by forming the depressions 15 cannot be obtained. When the channel region 14 is projected higher than 30 nm, the release of the stress in the element isolation regions 13 which stress acts on a lower part of the channel region 14 becomes saturated, and thus further stress does not occur in the channel region 14.

As shown in the vertical sectional view of FIG. 3 including the line B-B', in the channel region 14, effects of direct stress from the element isolation regions 13 are suppressed. That is, in the channel region 14, stress (indicated by arrows B) occurs in a direction of releasing stress (indicated by arrows A) in a part of the semiconductor substrate 11 as the lower part of the channel region 14, which part is directly affected by the stress from the element isolation regions 13. The amount of projection of the channel region 14 can be adjusted by controlling the depth of the depressions 15. Incidentally, the surface of source-drain regions 27 and 28 including the above-described channel region 14 is formed at substantially the same height as the surface of the semiconductor substrate 11 in another region, for example.

It is known that an insulating film (for example a high density plasma (HDP) silicon oxide or the like) buried to form the element isolation regions 13 of the STI structure generally has compressive stress. The stress applied in the direction of gate width of the channel region 14 acts in a direction of degrading mobility. With the constitution of the above-described embodiment of the present invention, effects of the direct compressive stress from the element isolation regions 13 on the channel region 14 are suppressed, and tensile stress occurs in the channel region 14 in a direction of releasing the compressive stress in the part of the semiconductor substrate 11 as the lower part of the channel region 14, which part is directly affected by the compressive stress from the element isolation regions 13. Thus, in the direction of gate width of the channel region 14, the tensile stress acts in a direction of improving the mobility of the transistor.

A gate electrode 22 is formed on the semiconductor substrate 11 with a gate insulating film 21 interposed between the gate electrode 22 and the semiconductor substrate 11. The gate electrode 22 is formed in such a manner as to extend over the channel region 14 and the depressions 15, for example. A high dielectric constant (High-k) film, for example, can be used as the gate insulating film 21. The high dielectric constant film includes for example a nitrided hafnium silicate (HfSiON) film, a hafnium nitride or oxide or oxynitride film, and an aluminum nitride or oxide or oxynitride film. Incidentally, an ordinary silicon oxide film can also be used as the gate insulating film 21. A single-layer structure of a metal or a metallic compound for a metal gate or a laminated structure, for example, can be used for the gate electrode 22. Incidentally, polysilicon can also be used for the gate electrode 22. A silicon nitride film, for example, is used as a hard mask 53.

Offset spacers 23 are formed on the side walls of the gate electrode 22 (including the gate insulating film 21). The offset spacers 23 are formed by an insulating thin film of about 1 nm to 10 nm, for example. An insulating film having etching selectivity with respect to the element isolation regions 13, for example, is used as the insulating thin film, and the insulating thin film is formed of silicon nitride (SiN), for example.

Extension regions 24 and 25 are formed in the semiconductor substrate 11 on both sides of the gate electrode 22 with the offset spacers 23 interposed between the extension regions 24 and 25 and the gate electrode 22. For the extension regions 24 and 25, an n-type impurity such as arsenic ($As^+$), phosphorus ($P^+$) or the like is used when an NMOS transistor is formed, for example, and a p-type impurity such as boron ($B^+$), indium ($In^+$) or the like is used when a PMOS transistor is formed. The extension regions 24 and 25 are formed with a shallow junction.

Further, side wall spacers 26 are formed on both sides of the gate electrode 22 with the offset spacers 23 interposed between the side wall spacers 26 and the gate electrode 22. The source-drain regions 27 and 28 are formed in the semiconductor substrate 11 on both sides of the gate electrode 22 with the extension regions 24 and 25 interposed between the source-drain regions 27 and 28 and the gate electrode 22. Resistance lowering layers 31 and 32 are formed on the source-drain regions 27 and 28. The resistance lowering layers 31 and 32 are for example formed of cobalt (Co), nickel (Ni), platinum (Pt) or a compound thereof. The compound includes a metal silicide of these metals. As is also shown in the vertical sectional view of FIG. 5 including the line [D-D'] *C-C'*, the source-drain regions 27 and 28 are formed to a position deeper than the surface of the parts of the element isolation regions 13 formed on both sides (direction of gate width) of the source-drain regions 27 and 28. Thus, even when the resistance lowering layers 31 and 32 (the resistance lowering layer 32 is not shown in FIG. 5) are formed by a salicide process, for example, on the surfaces of the source-drain regions 27 and 28 (the source-drain region 28 is not shown in FIG. 5), the resistance lowering layers 31 and 32 do not come close to the semiconductor substrate 11 or are not connected to the semiconductor substrate 11. This prevents a leak of current from the resistance lowering layers 31 and 32 to the semiconductor substrate 11.

Further, an interlayer insulating film 41 is formed over the semiconductor substrate 11 in such a manner as to cover the semiconductor device 1 of the above-described constitution formed on the semiconductor substrate 11. Incidentally, though not shown in the figures, contact parts bonded to the gate electrode 22 and the source-drain regions 27 and 28, wiring connected to each of the contact parts, and the like are formed in the interlayer insulating film 41.

The semiconductor device 1 of the above-described constitution has an advantage in that it is possible to produce stress in the channel region 14 directly under the gate electrode 22 in a gate width direction advantageous to a transistor characteristic (carrier mobility), and thus improve on current Ion of the transistor, so that the performance of the transistor is improved. In addition, because the junction positions of the source-drain regions 27 and 28 are deeper than the surfaces of the element isolation regions, even when the resistance lowering layers 31 and 32 made of a silicide layer for lower resistance are formed on the surfaces of the source-drain regions 27 and 28, a leak of current between the resistance lowering layers 31 and 32 and the semiconductor substrate 11 does not occur. The reliability of the semiconductor device (transistor) 1 is thereby improved. The above-described effects become greater as the semiconductor device (transistor) 1 is reduced in gate width.

Figure 10A:
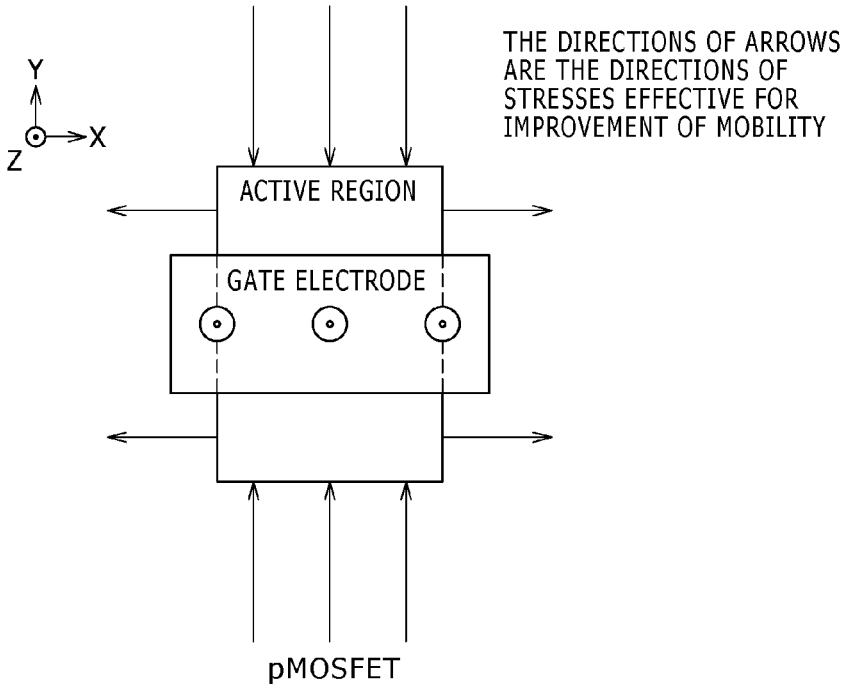
FIGS. 10A and 10B are schematic plan layout diagrams of assistance in explaining stresses applied to an active region of a transistor.
Figure 10B:
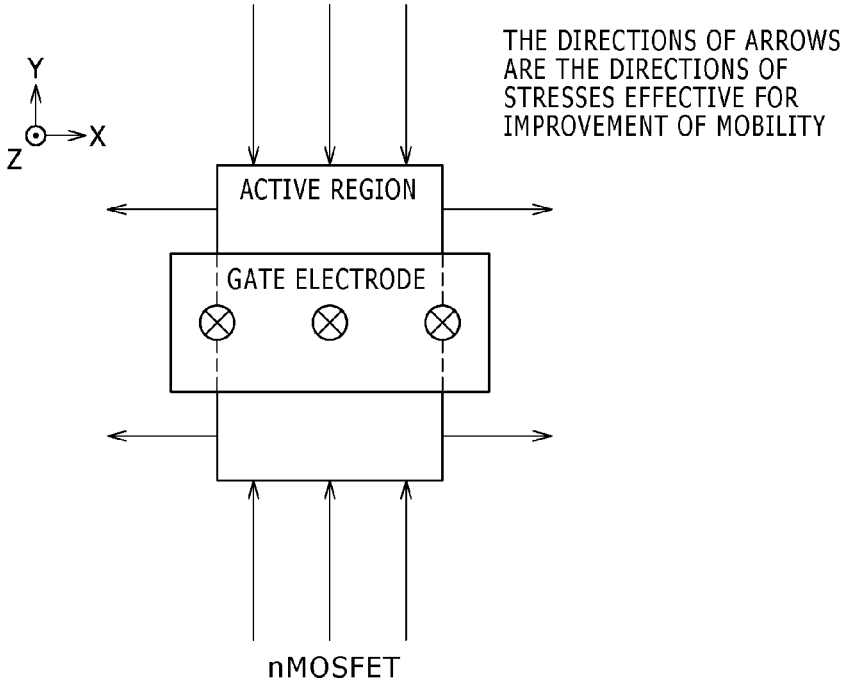
Figure 11:
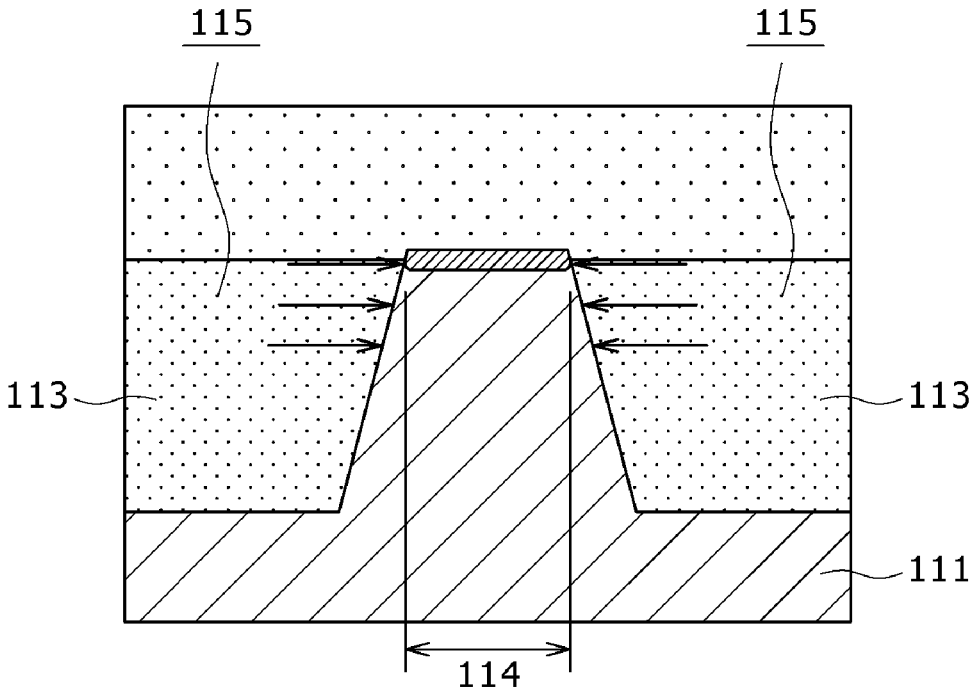
FIG. 11 is a schematic configuration sectional view showing a section in a gate width direction of a two-dimensional type (planar) MOS transistor in related art.
Figure 12:
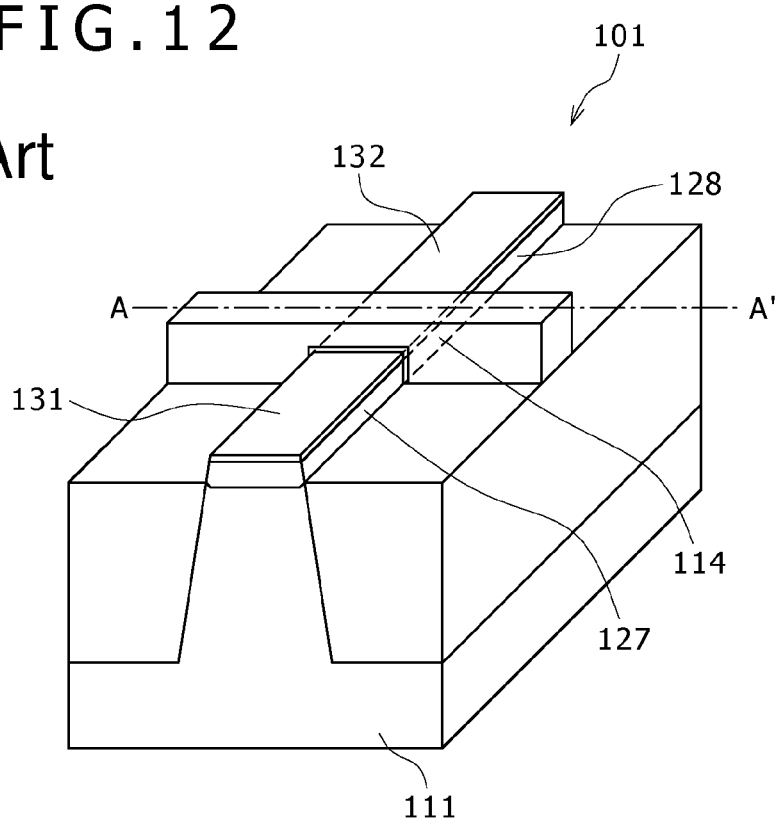
FIG.12 Prior Art
FIG. 12 is a schematic perspective view schematically showing a three-dimensional structure of an ordinary MOS transistor.
Figure 13:
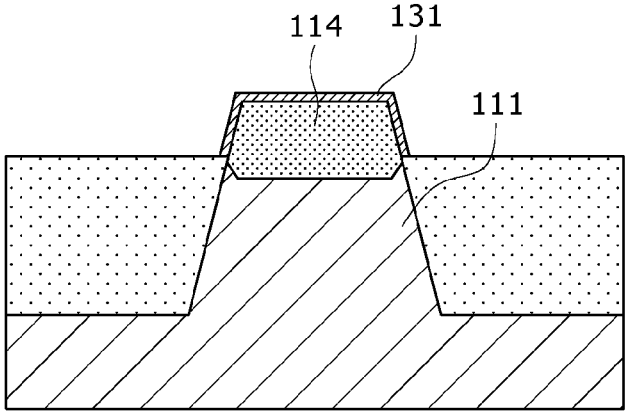
FIG.13 Prior Art
FIG. 13 is a vertical sectional view including a line A-A' of FIG. 12.

Further, as shown in FIGS. 10A and 10B described above, the more the stress in the y-direction originally applied to the channel region, the greater the effect of improvement of the on current Ion. The greater effect can be obtained by applying a stress in the y-direction by forming the source-drain regions of a silicon germanium epitaxial layer or providing a covering of a compressive stress liner for a pMOSFET or by applying a stress in the y-direction by forming the source-drain regions of a silicon carbide epitaxial layer or providing a covering of a tensile stress liner for an nMOSFET. These constitutions will be described later as a second embodiment and a third embodiment of a semiconductor device according to the present invention.

An embodiment (first embodiment) of a semiconductor device manufacturing method according to the present invention will next be described with reference to manufacturing process sectional views of FIGS. 6A to 6P. This manufacturing method will be described as an example of manufacturing the constitution of the semiconductor device 1. Incidentally, FIGS. 6A, 6K, 6L, and 6P are sections in a so-called gate width direction (sections at a position corresponding to the vertical section including the line B-B' in FIG. 1 described above), and FIGS. 6B to 6J and 6M to 6O are sections in a so-called gate length direction (sections at a position corresponding to the vertical section including the line A-A' in FIG. 1 described above).

Figure 6A:
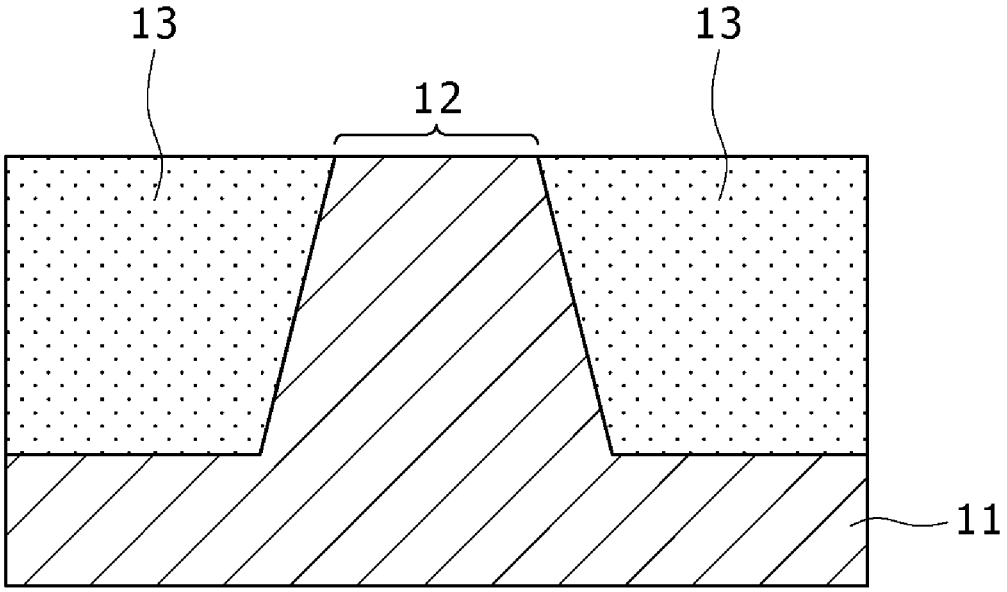
FIGS. 6A to 6P are manufacturing process sectional views of one embodiment (first embodiment) of a semiconductor device manufacturing method according to the present invention.

As shown in FIG. 6A, element isolation regions 13 for electrically isolating an element formation region 12 in which a transistor is formed are formed in a semiconductor substrate 11. A silicon substrate, for example, is used as the semiconductor substrate 11, and an ordinary STI (Shallow Trench Isolation) structure is used for the element isolation regions 13.

Figure 6B:
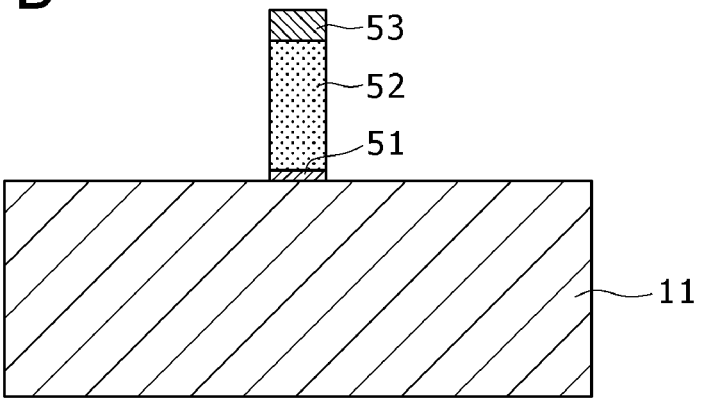

Next, as shown in FIG. 6B, a protective film (not shown) for preventing channeling when performing ion implantation for introducing an impurity into the semiconductor substrate 11 is formed on the semiconductor substrate 11. This protective film is formed by a silicon oxide ($SiO_2$) film, for example. As an example, a method of forming the protective film is carried out by oxidizing the surface of the semiconductor substrate 11.

Next, impurity injection for performing transistor element isolation and threshold value adjustment is performed by ion implantation. After the ion implantation, the silicon oxide ($SiO_2$) film previously formed as the ion implantation protective film is removed to expose the surface of the semiconductor substrate 11.

Next, a dummy gate insulating film 51, a dummy gate 52, and a hard mask 53 are formed in order on the semiconductor substrate 11.

The dummy gate insulating film 51, for example an oxide film is first formed with a thickness of about 1 nm to 3 nm on the semiconductor substrate 11. A dummy gate forming film is next formed on the dummy gate insulating film 51. This dummy gate forming film is formed by depositing polycrystalline silicon (polysilicon) to a thickness of about 100 nm to 200 nm, for example. A chemical vapor deposition (CVD) method, for example, is used as a method of forming the dummy gate forming film. Further, a hard mask layer is formed by a silicon nitride film, for example, on the dummy gate forming film. This silicon nitride film is formed to a thickness of 30 nm to 100 nm, for example, by using a chemical vapor deposition (CVD) method, for example.

Next, a resist film (not shown) for lithography is formed on the hard mask layer. A resist suited to an exposure source is used for the resist film. Then, the resist film is exposed to light to form a dummy gate pattern (not shown), and thereafter, with the dummy gate pattern used as an etching mask, the hard mask layer is etched to form a hard mask 53. Optical lithography using for example KrF, ArF, $F_2$ or the like for a light source or electron beam lithography is used for the light exposure in the above-described lithography. In the etching of the hard mask layer, the hard mask layer can be processed into a line width smaller than that of the pattern of the resist (for example by sliming or trimming) to reduce gate length. Next, the dummy gate pattern formed by the resist film is removed, and with the hard mask 53 formed by the etching process as an etching mask, the dummy gate forming film is processed by dry etching to form a dummy gate 52. The line width of the dummy gate 52 at this time is set at a few nm to a few ten nm. In this etching, the dummy gate insulating film 51 is also etched.

Figure 6C:
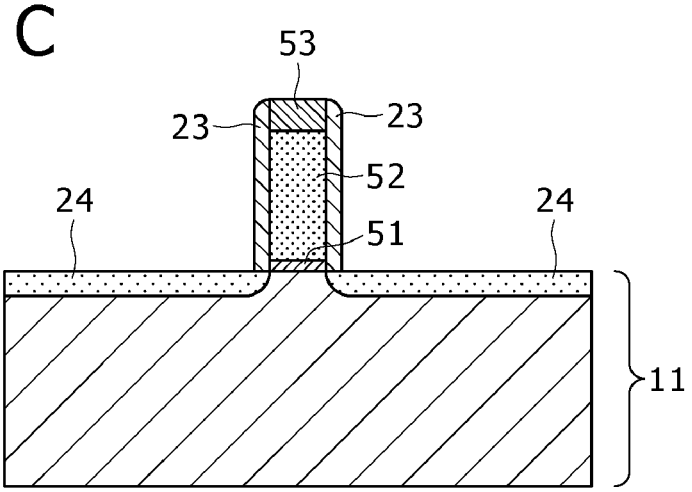

Next, as shown in FIG. 6C, offset spacers 23 are formed on side walls of the dummy gate 52 (a part formed by the dummy gate insulating film 51, the dummy gate 52, and the hard mask 53 will hereinafter be referred to as a dummy gate). The offset spacers 23 are made by forming an insulating thin film of about 1 nm to 10 nm, for example, so as to cover the dummy gate 52, and then etching back the insulating thin film such that the insulating thin film remains only on the side walls of the dummy gate 52. The insulating thin film forming the offset spacers 23 is formed by silicon oxide ($SiO_2$) or silicon nitride (SiN), for example. The insulating thin film on the semiconductor substrate 11 is removed by the above-described etching back.

Next, extension regions 24 and 25 are formed in the semiconductor substrate 11 on both sides of the dummy gate 52 with the offset spacers 23 interposed between the extension regions 24 and 25 and the dummy gate 52. The extension regions 24 and 25 are formed by ion implantation, for example. An n-type impurity such as arsenic ($As^+$), phosphorus ($P^+$) or the like is used when an NMOS transistor is formed, for example, and a p-type impurity such as boron ($B^+$), indium ($In^+$) or the like is used when a PMOS transistor is formed. For example, the implantation is performed with a low acceleration energy (100 eV to 300 eV) and a dose of $5\times10^{14}$ (/cm$^2$) to $2\times10^{15}$ (/cm$^2$), whereby the extension regions 24 and 25 are formed with a shallow junction.

Figure 6D:
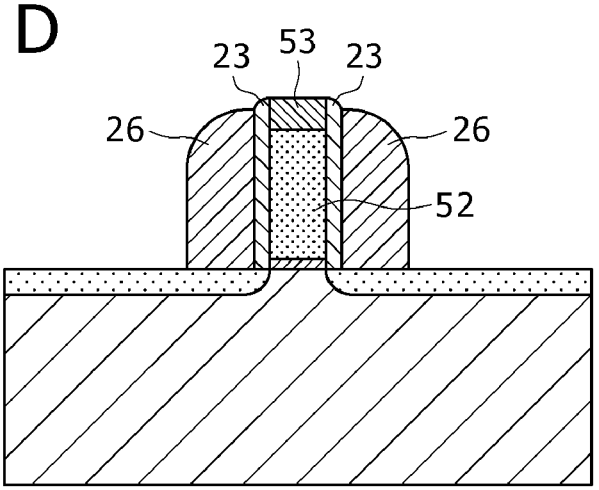

Next, as shown in FIG. 6D, side wall spacers 26 are formed on both sides of the dummy gate 52 with the offset spacers 23 interposed between the side wall spacers 26 and the dummy gate 52. At the time of etching back for forming the side wall spacers 26, the etching is performed such that the hard mask 53 remains.

Figure 6E:
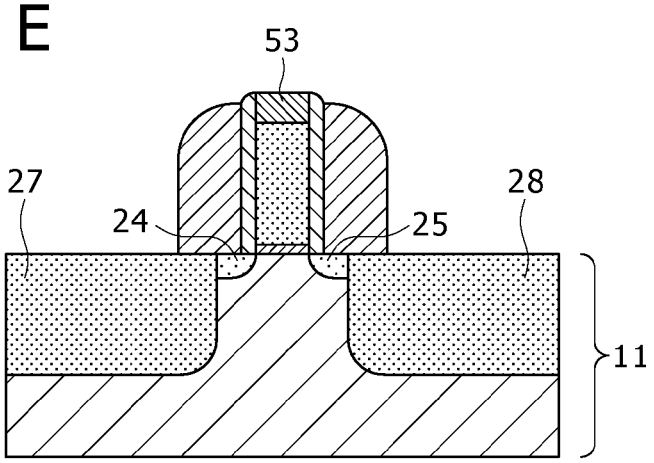

Next, as shown in FIG. 6E, source-drain regions 27 and 28 are formed in the semiconductor substrate 11 on both sides of the dummy gate 52 with the extension regions 24 and 25 respectively interposed between the source-drain regions 27 and 28 and the dummy gate 52. Thereafter, an activation process is performed by rapid thermal annealing (RTA) at about 1000° C., for example.

Incidentally, when a PMOS transistor and an NMOS transistor are formed on the semiconductor substrate 11, impurity injection for adjusting the threshold value of the transistors, ion implantation for forming the extension regions 24 and 25, and ion implantation for forming the source-drain regions 27 and 28 are each performed for an NMOS region and a PMOS region separately. For example, a first mask is formed in the NMOS region, ion implantation is performed in the PMOS region, and then the first mask is removed. Next, a second mask is formed in the PMOS region, and ion implantation is performed in the NMOS region. The second mask is thereafter removed.

Figure 6F:
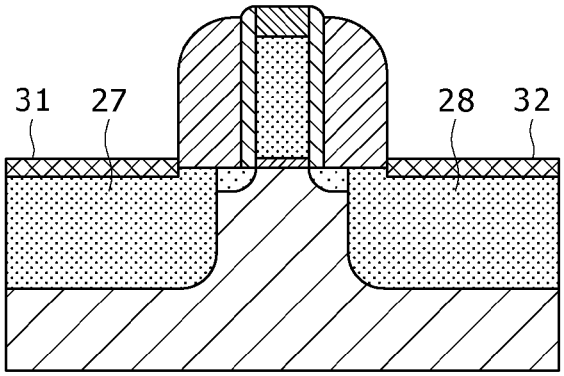

Next, as shown in FIG. 6F, resistance lowering layers 31 and 32 are formed on the source-drain regions 27 and 28. The resistance lowering layers 31 and 32 are selectively formed on the surfaces of the source-drain regions 27 and 28 by a salicide process. The resistance lowering layers 31 and 32 are for example formed of cobalt (Co), nickel (Ni), platinum (Pt) or a compound thereof. The compound includes a metal silicide of these metals.

Figure 6G:
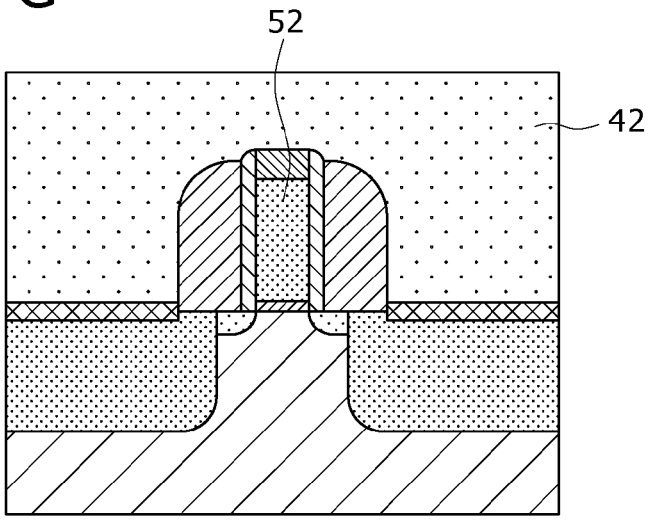

Next, as shown in FIG. 6G, a first interlayer insulating film 42 covering the dummy gate 52 and the like is formed.

Figure 6H:
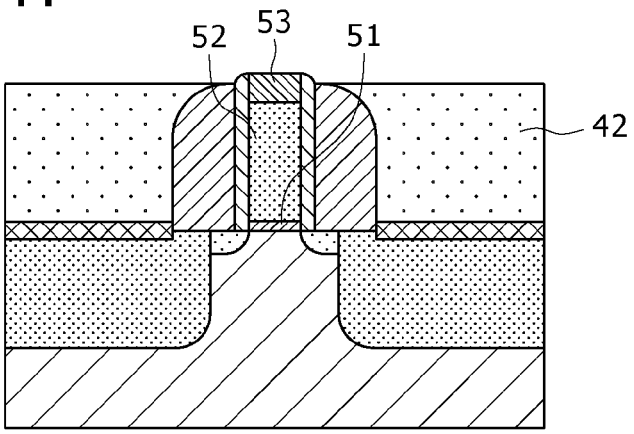

Next, as shown in FIG. 6H, an upper part of the first interlayer insulating film 42 is removed to expose the surface of the hard mask 53. A chemical mechanical polishing (CMP) method, for example, is used to remove the upper part of the first interlayer insulating film 42. Incidentally, another polishing method may be used, and the upper part of the first interlayer insulating film 42 can be removed by etching back. Incidentally, the chemical mechanical polishing method can planarize the polished surface.

Figure 6I:
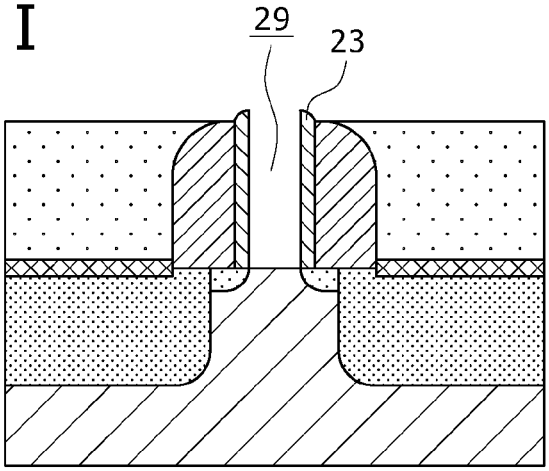
Figure 6J:
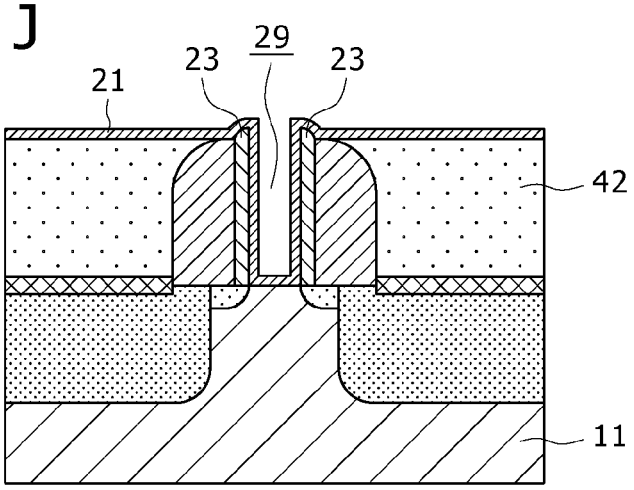
Figure 6K:
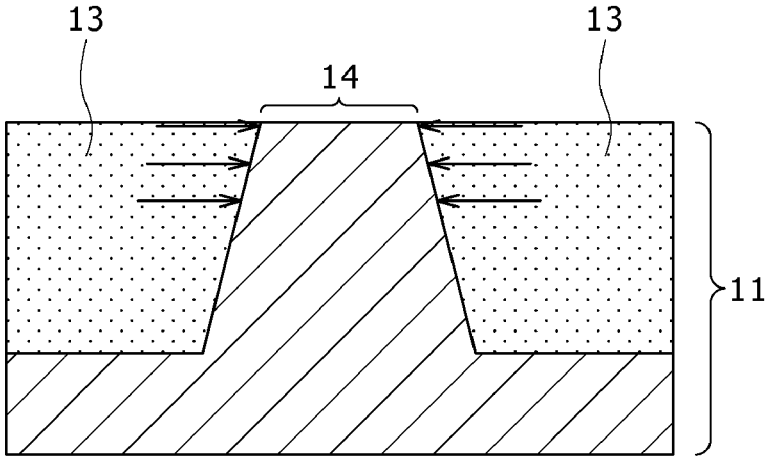

Next, the hard mask 53 and the dummy gate 52 are removed. Dry etching, for example, is used for the removing process. Dry etching damage to the semiconductor substrate 11 is prevented by leaving the dummy gate insulating film 51 in the vapor dry etching. Then the dummy gate insulating film 51 is removed. Wet etching, for example, is used for the removing process. Etching damage to the semiconductor substrate 11 is prevented by performing the removing process by wet etching. As a result, as shown in FIG. 6I, a groove 29 enclosed by the offset spacers 23 is formed. As shown in the sectional view of FIG. 6K in the gate width direction, the channel region 14 formed in the semiconductor substrate 11 directly under the region where the dummy gate 52 is formed is at substantially the same height as the surfaces of the element isolation regions 13. The stress of the element isolation regions 13 is applied to the channel region 14. Thus, the channel region 14 is directly affected by the stress of the element isolation regions 13.

Figure 6L:
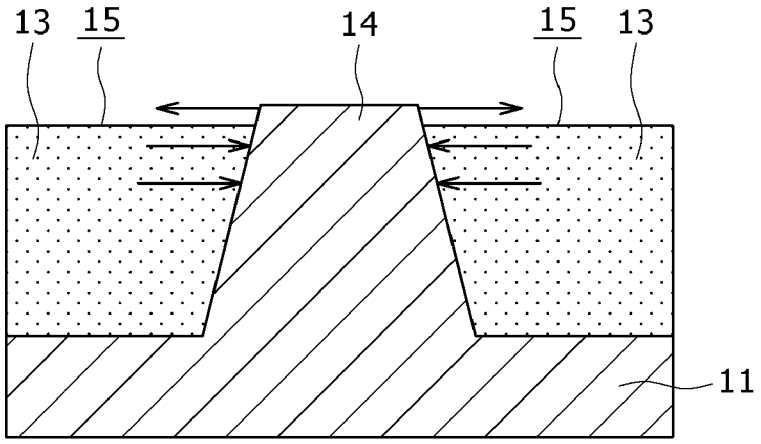

As shown in the sectional view of FIG. 6L in the gate width direction, the above-described wet etching can lower the surfaces of the element isolation regions 13 under the region where the dummy gate 52 was formed by forming depressions 15. Thereby the height of the element isolation regions 13 under the region where the dummy gate 52 was formed can be made lower than that of the surface of the semiconductor substrate 11 (channel region 14). The height of the element isolation regions 13 can be controlled by an amount of wet etching, and an amount of projection of the channel region 14 from the surfaces of the element isolation regions 13 is a height of 3 nm to 30 nm inclusive, for example. The above-described wet etching does not lower the height of the element isolation regions 13 on both sides (in the gate width direction) of the source-drain regions 27 and 28. In addition, the source-drain regions 27 and 28 including the above-described channel region 14 can be maintained at substantially the same height as the semiconductor substrate 11 in another region, for example.

Next, as shown in FIG. 6J, a gate insulating film 21 is formed on the semiconductor substrate 11 within the groove 29. This gate insulating film 21 is actually formed on the inner surfaces of the groove 29 and the surface of the first interlayer insulating film 42. The gate insulating film 21 can be formed by an insulating film such as a high dielectric constant (High-k) film or a silicon oxide film, for example. In this case, the gate insulating film 21 is formed by a high dielectric constant film as an example. In this case, heat treatment (annealing treatment) for modifying the gate insulating film 21 is performed.

Figure 6M:
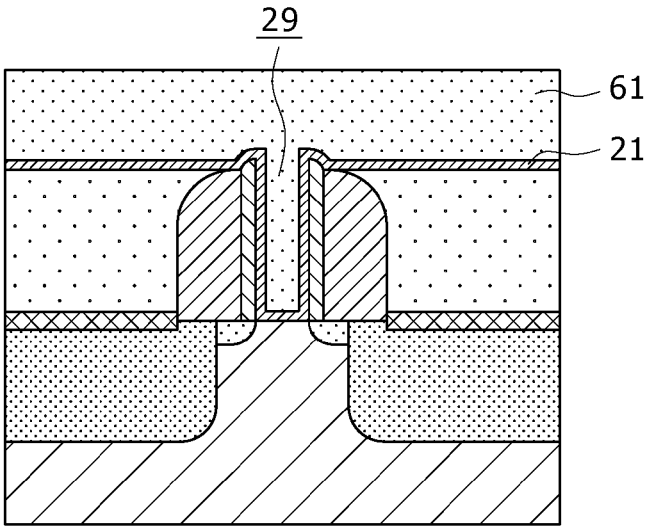

Next, as shown in FIG. 6M, a gate electrode forming film 61 is formed on the gate insulating film 21 in such a manner as to fill the inside of the groove 29. This gate electrode forming film 61 is formed by a laminate of metals or metallic compounds for a metal gate or a single-layer structure, for example.

Figure 6N:
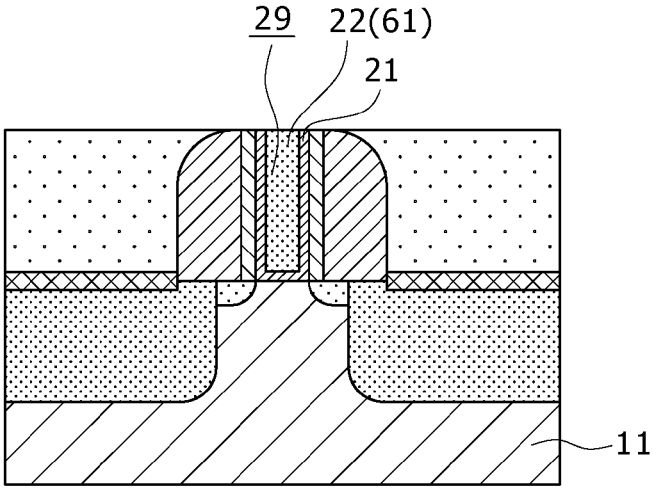

Next, as shown in FIG. 6N, a surplus part of the gate electrode forming film 61 is removed, and a gate electrode 22 is formed by the gate electrode forming film 61 on the semiconductor substrate 11 within the groove 29 with the gate insulating film 21 interposed between the gate electrode 22 and the semiconductor substrate 11. The removing process is performed by a chemical mechanical polishing (CMP) method, for example.

Figure 6O:
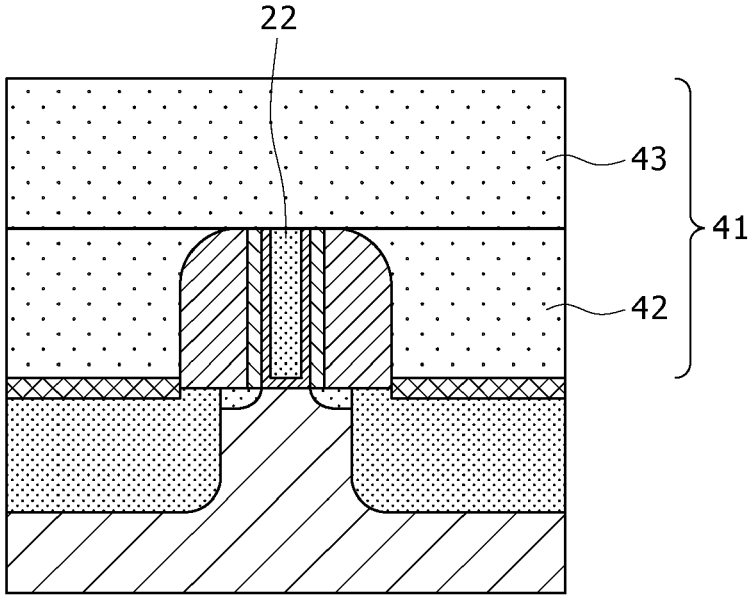
Figure 6P:
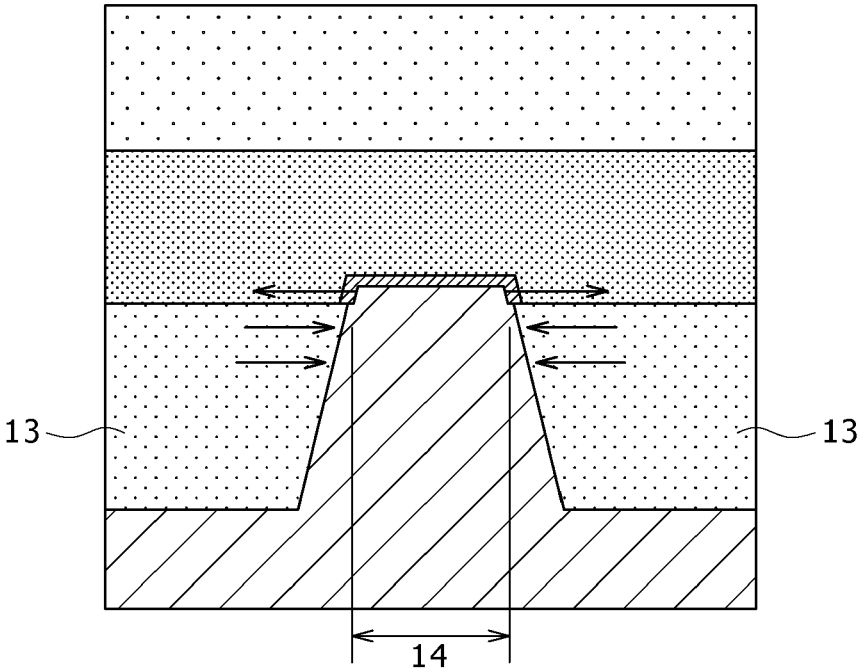

Next, as shown in FIG. 6O, a second interlayer insulating film 43 is formed on the first interlayer insulating film 42 in such a manner as to cover the gate electrode 22. The first interlayer insulating film 42 and the second interlayer insulating film 43 form an interlayer insulating film 41. As shown in the sectional view of FIG. 6P in the gate width direction at this time, stress in the channel region 14 at this time is maintained in a stress state that occurred when removing the top parts of the element isolation regions 13 under the region where the dummy gate 52 had been formed as described above with reference to FIG. 6L.

Though not shown, contact parts electrically connected to the respective source-drain regions 27 and 28, metallic wiring routed to the contact parts, and the like are thereafter formed in the interlayer insulating film 41. The semiconductor device is thereby completed.

The semiconductor device manufacturing method according to the first embodiment has an advantage in that it is possible to produce stress in the channel region 14 directly under the gate electrode 22 in a gate width direction advantageous to a transistor characteristic (carrier mobility), and thus improve on current Ion of the transistor, so that the performance of the transistor is improved. In addition, because the junction positions of the source-drain regions 27 and 28 are deeper than the surfaces of the element isolation regions 13, even when the resistance lowering layers 31 and 32 made of a silicide layer for lower resistance are formed on the surfaces of the source-drain regions 27 and 28, a leak of current between the resistance lowering layers 31 and 32 and the semiconductor substrate 11 does not occur. The reliability of the semiconductor device (transistor) 1 is thereby improved. The above-described effects become greater as the semiconductor device (transistor) 1 is reduced in gate width.

Figure 7A:
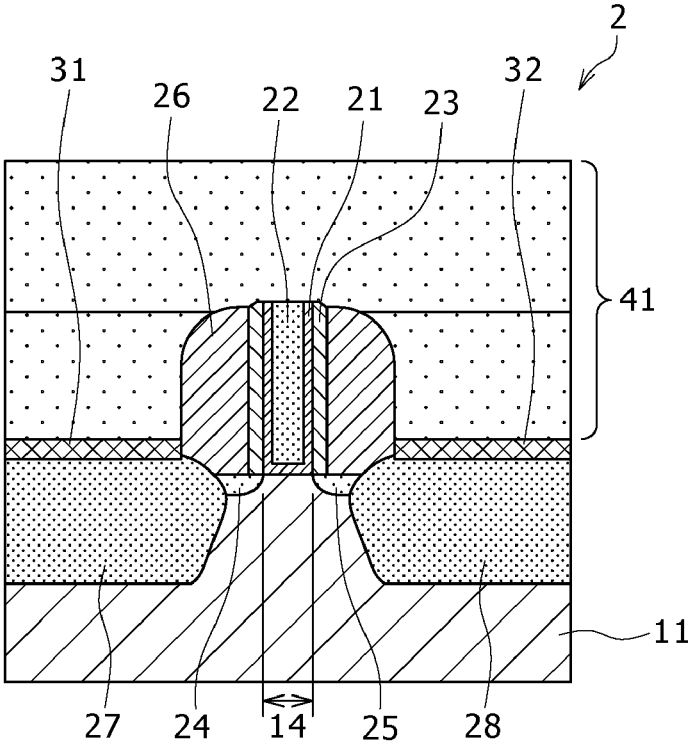
FIGS. 7A and 7B are schematic configuration sectional views of an embodiment (second embodiment) of a semiconductor device according to the present invention.
Figure 7B:
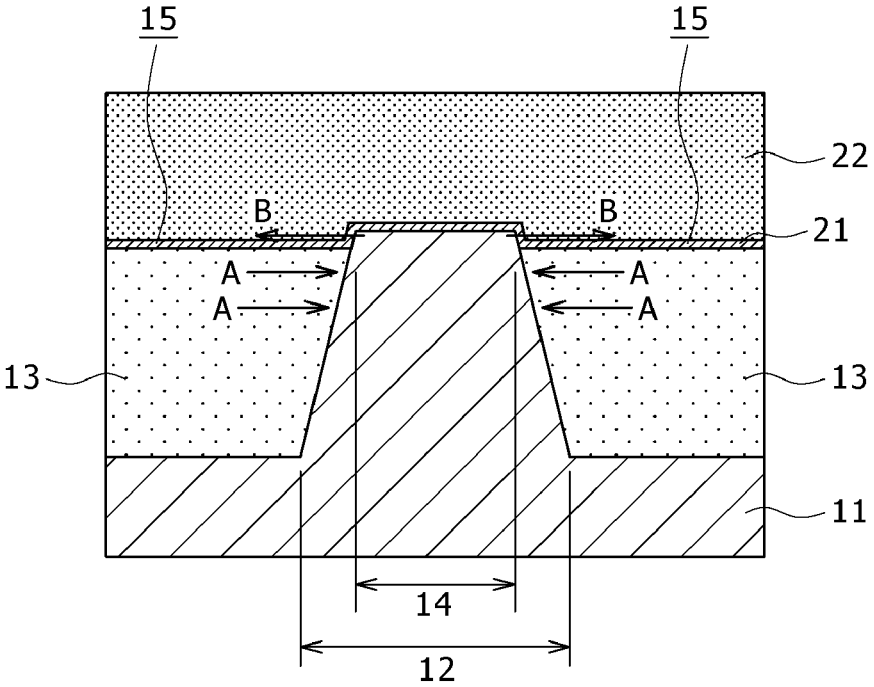

An embodiment (second embodiment) of a semiconductor device according to the present invention will next be described with reference to a schematic configuration sectional view of FIGS. 7A and 7B. FIG. 7A shows a section in a gate length direction, and FIG. 7B shows a section in a gate width direction. The semiconductor device 2 shown in FIGS. 7A and 7B is formed by using a stress applying layer applying stress to the channel region 14 as the source-drain regions 27 and 28 in the semiconductor device 1 according to the first embodiment.

Specifically, as shown in FIGS. 7A and 7B, element isolation regions 13 for electrically isolating an element formation region 12 in which a transistor is formed are formed in a semiconductor substrate 11. A silicon substrate, for example, is used as the semiconductor substrate 11, and an ordinary STI (Shallow Trench Isolation) structure is used for the element isolation regions 13. Thus, a part of the semiconductor substrate 11 which part is interposed between the element isolation regions (not shown) is the element formation region 12.

Depressions 15 are formed in upper parts of the element isolation regions 13 formed on both sides of a channel region 14 formed in the element formation region 12 so that the channel region 14 projects from the surfaces of the element isolation regions 13. Thus, the depressions 15 are formed in the element isolation regions 13 on both sides of the channel region 14 such that only the channel region 14 projects from the element isolation regions 13. In this case, as in the first embodiment, an amount of projection of the channel region 14 from the surfaces of the element isolation regions 13 at the bottom of the depressions 15 is set at 3 nm to 30 nm inclusive, for example. Thereby, effects of direct stress from the element isolation regions 13 are suppressed in the channel region 14. That is, in the channel region 14, stress (indicated by arrows B) occurs in a direction of releasing stress (indicated by arrows A) in a part of the semiconductor substrate 11 as the lower part of the channel region 14, which part is directly affected by the stress from the element isolation regions 13. The amount of projection of the channel region 14 can be adjusted by controlling the depth of the depressions 15.

A gate electrode 22 is formed on the semiconductor substrate 11 with a gate insulating film 21 interposed between the gate electrode 22 and the semiconductor substrate 11. The gate electrode 22 is formed in such a manner as to extend over the channel region 14 and the depressions 15, for example. As the gate insulating film 21, for example, a high dielectric constant (High-k) film can be used, or an ordinary silicon oxide film can also be used. A single-layer structure of a metal or a metallic compound for a metal gate or a laminated structure, for example, can be used for the gate electrode 22. Incidentally, polysilicon can also be used for the gate electrode 22. A silicon nitride film, for example, is used as a hard mask 53.

Offset spacers 23 are formed on the side walls of the gate electrode 22 (including the gate insulating film 21). The offset spacers 23 are formed by an insulating thin film of about 1 nm to 10 nm, for example. An insulating film having etching selectivity with respect to the element isolation regions 13, for example, is used as the insulating thin film, and the insulating thin film is formed of silicon nitride (SiN), for example.

Extension regions 24 and 25 are formed in the semiconductor substrate 11 on both sides of the gate electrode 22 with the offset spacers 23 interposed between the extension regions 24 and 25 and the gate electrode 22. For the extension regions 24 and 25, an n-type impurity such as arsenic ($As^+$), phosphorus ($P^+$) or the like is used when an NMOS transistor is formed, for example, and a p-type impurity such as boron ($B^+$), indium ($In^+$) or the like is used when a PMOS transistor is formed. The extension regions 24 and 25 are formed with a shallow junction.

Further, side wall spacers 26 are formed on both sides of the gate electrode 22 with the offset spacers 23 interposed between the side wall spacers 26 and the gate electrode 22. Source-drain regions 27 and 28 are formed in the semiconductor substrate 11 on both sides of the gate electrode 22 with the extension regions 24 and 25 interposed between the source-drain regions 27 and 28 and the gate electrode 22. The source-drain regions 27 and 28 are formed by a stress applying layer applying stress to the channel region 14 between the source-drain regions 27 and 28. For example, when the semiconductor device 2 is a p-type FET (field-effect transistor), the source-drain regions 27 and 28 are formed by a silicon germanium layer grown by epitaxial growth, and apply compressive stress to the channel region 14. When the semiconductor device 2 is an n-type FET (field-effect transistor), the source-drain regions 27 and 28 are formed by a silicon carbide layer grown by epitaxial growth, and apply tensile stress to the channel region 14. In either case, it is effective to form the source-drain regions 27 and 28 into an embedded source-drain structure raised from the surface of the semiconductor substrate 11. Resistance lowering layers 31 and 32 are formed on the source-drain regions 27 and 28. The resistance lowering layers 31 and 32 are for example formed of cobalt (Co), nickel (Ni), platinum (Pt) or a compound thereof. The compound includes a metal silicide of these metals.

The source-drain regions 27 and 28 are formed to a position deeper than the surface of the parts of the element isolation regions 13 formed on both sides (direction of gate width) of the source-drain regions 27 and 28. Thus, even when the resistance lowering layers 31 and 32 are formed by a salicide process, for example, on the surfaces of the source-drain regions 27 and 28, the resistance lowering layers 31 and 32 do not come close to the semiconductor substrate 11 or are not connected to the semiconductor substrate 11. This prevents a leak of current from the resistance lowering layers 31 and 32 to the semiconductor substrate 11.

Further, an interlayer insulating film 41 is formed over the semiconductor substrate 11 in such a manner as to cover the semiconductor device 2 of the above-described constitution formed on the semiconductor substrate 11. Incidentally, though not shown in the figures, contact parts bonded to the gate electrode 22 and the source-drain regions 27 and 28, wiring connected to each of the contact parts, and the like are formed in the interlayer insulating film 41.

The semiconductor device 2 provides similar actions and effects to those of the semiconductor device 1, and applies stress effective to improve mobility also from the source-drain regions 27 and 28 to the channel region 14. The semiconductor device 2 therefore improves mobility more than the semiconductor device 1.

Figure 8A:
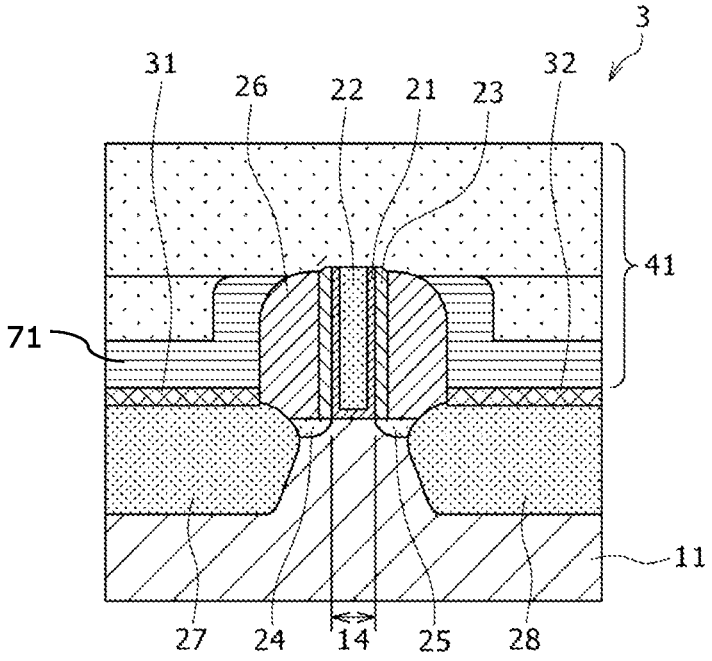
FIGS. 8A and 8B are schematic configuration sectional views of an embodiment (third embodiment) of a semiconductor device according to the present invention.
Figure 8B:
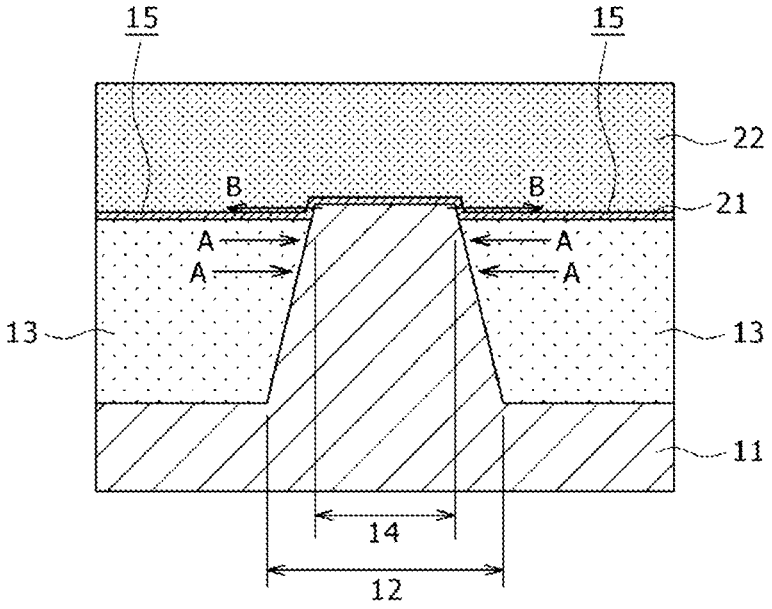

An embodiment (third embodiment) of a semiconductor device according to the present invention will next be described with reference to a schematic configuration sectional view of FIGS. 8A and 8B. FIG. 8A shows a section in a gate length direction, and FIG. 8B shows a section in a gate width direction. The semiconductor device 3 shown in FIGS. 8A and 8B is obtained by forming a stress liner film for applying stress to the channel region 14 in the semiconductor device 1 according to the first embodiment.

Specifically, as shown in FIGS. 8A and 8B, element isolation regions 13 for electrically isolating an element formation region 12 in which a transistor is formed are formed in a semiconductor substrate 11. A silicon substrate, for example, is used as the semiconductor substrate 11, and an ordinary STI (Shallow Trench Isolation) structure is used for the element isolation regions 13. Thus, a part of the semiconductor substrate 11 which part is interposed between the element isolation regions (not shown) is the element formation region 12.

Depressions 15 are formed in upper parts of the element isolation regions 13 formed on both sides of a channel region 14 formed in the element formation region 12 so that the channel region 14 projects from the surfaces of the element isolation regions 13. Thus, the depressions 15 are formed in the element isolation regions 13 on both sides of the channel region 14 such that only the channel region 14 projects from the element isolation regions 13. In this case, as in the first embodiment, an amount of projection of the channel region 14 from the surfaces of the element isolation regions 13 at the bottom of the depressions 15 is set at 3 nm to 30 nm inclusive, for example. Thereby, effects of direct stress from the element isolation regions 13 are suppressed in the channel region 14. That is, in the channel region 14, stress (indicated by arrows B) occurs in a direction of releasing stress (indicated by arrows A) in a part of the semiconductor substrate 11 as the lower part of the channel region 14, which part is directly affected by the stress from the element isolation regions 13. The amount of projection of the channel region 14 can be adjusted by controlling the depth of the depressions 15.

A gate electrode 22 is formed on the semiconductor substrate 11 with a gate insulating film 21 interposed between the gate electrode 22 and the semiconductor substrate 11. The gate electrode 22 is formed in such a manner as to extend over the channel region 14 and the depressions 15, for example. As the gate insulating film 21, for example, a high dielectric constant (High-k) film can be used, or an ordinary silicon oxide film can also be used. A single-layer structure of a metal or a metallic compound for a metal gate or a laminated structure, for example, can be used for the gate electrode 22. Incidentally, polysilicon can also be used for the gate electrode 22. A silicon nitride film, for example, is used as a hard mask 53.

Offset spacers 23 are formed on the side walls of the gate electrode 22 (including the gate insulating film 21). The offset spacers 23 are formed by an insulating thin film of about 1 nm to 10 nm, for example. An insulating film having etching selectivity with respect to the element isolation regions 13, for example, is used as the insulating thin film, and the insulating thin film is formed of silicon nitride (SiN), for example.

Extension regions 24 and 25 are formed in the semiconductor substrate 11 on both sides of the gate electrode 22 with the offset spacers 23 interposed between the extension regions 24 and 25 and the gate electrode 22. For the extension regions 24 and 25, an n-type impurity such as arsenic ($As^+$), phosphorus ($P^+$) or the like is used when an NMOS transistor is formed, for example, and a p-type impurity such as boron ($B^+$), indium ($In^+$) or the like is used when a PMOS transistor is formed. The extension regions 24 and 25 are formed with a shallow junction.

Further, side wall spacers 26 are formed on both sides of the gate electrode 22 with the offset spacers 23 interposed between the side wall spacers 26 and the gate electrode 22. Source-drain regions 27 and 28 are formed in the semiconductor substrate 11 on both sides of the gate electrode 22 with the extension regions 24 and 25 interposed between the source-drain regions 27 and 28 and the gate electrode 22. Resistance lowering layers 31 and 32 are formed on the source-drain regions 27 and 28. The resistance lowering layers 31 and 32 are for example formed of cobalt (Co), nickel (Ni), platinum (Pt) or a compound thereof. The compound includes a metal silicide of these metals.

The source-drain regions 27 and 28 are formed to a position deeper than the surface of the parts of the element isolation regions 13 formed on both sides (direction of gate width) of the source-drain regions 27 and 28. Thus, even when the resistance lowering layers 31 and 32 are formed by a salicide process, for example, on the surfaces of the source-drain regions 27 and 28, the resistance lowering layers 31 and 32 do not come close to the semiconductor substrate 11 or are not connected to the semiconductor substrate 11. This prevents a leak of current from the resistance lowering layers 31 and 32 to the semiconductor substrate 11.

Further, a stress liner film 71 for applying stress to the channel region 14 is formed in such a manner as to cover the semiconductor device 3 of the above-described constitution formed on the semiconductor substrate 11. This stress liner film 71 is formed by a silicon nitride film, for example, and is made by a plasma CVD method, for example. By changing a condition for forming the film, it is possible to form a silicon nitride film having tensile stress or form a silicon nitride film having compressive stress. For example, when the semiconductor device 3 is a p-type FET (field-effect transistor), a compressive stress liner film is used as the stress liner film 71 to apply compressive stress to the channel region 14. When the semiconductor device 3 is an n-type FET (field-effect transistor), a tensile stress liner film is used as the stress liner film 71 to apply tensile stress to the channel region 14.

Further, an interlayer insulating film 41 is formed. Incidentally, though not shown in the figures, contact parts bonded to the gate electrode 22 and the source-drain regions 27 and 28, wiring connected to each of the contact parts, and the like are formed in the interlayer insulating film 41.

In order to form the semiconductor device 3, in the manufacturing method according to the first embodiment, the gate electrode 22 is formed on the gate insulating film 21 within the groove 29, and thereafter the first interlayer insulating film 42 is removed. Next, the stress liner film 71 is formed so as to cover the gate electrode 22 and the side wall spacers 26. Next, the first interlayer insulating film 42 is formed again, and further the second interlayer insulating film 43 is formed. It is desirable to planarize the surface of the re-formed first interlayer insulating film 42.

The semiconductor device 3 provides similar actions and effects to those of the semiconductor device 1, and applies stress effective to improve mobility also from the stress liner film 71 to the channel region 14. The semiconductor device 3 therefore improves mobility more than the semiconductor device 1.

In addition, a stress liner film 71 similar to the stress liner film 71 used in the semiconductor device 3 according to the third embodiment can be formed in the semiconductor device 2 according to the second embodiment. In other words, source-drain regions 27 and 28 made of a stress applying layer similar to the stress applying layer used in the semiconductor device 2 according to the second embodiment can be formed in the semiconductor device 3 according to the third embodiment.

An embodiment (second embodiment) of a semiconductor device manufacturing method according to the present invention will next be described with reference to manufacturing process sectional views of FIGS. 9A to 9O. This manufacturing method will be described as a method of manufacturing the constitution of the semiconductor device 2.

As described above with reference to FIG. 6A, element isolation regions (not shown) for electrically isolating an element formation region 12 in which a transistor is formed are formed in a semiconductor substrate 11. A silicon substrate, for example, is used as the semiconductor substrate 11, and an ordinary STI (Shallow Trench Isolation) structure is used for the element isolation regions 13.

Figure 9A:
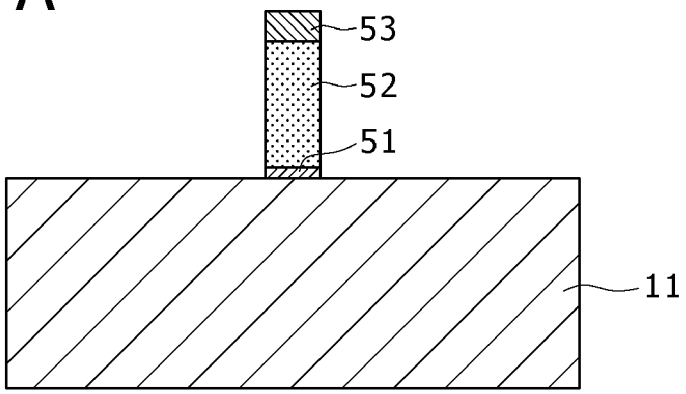
FIGS. 9A to 9O are manufacturing process sectional views of one embodiment (second embodiment) of a semiconductor device manufacturing method according to the present invention.

Next, as shown in FIG. 9A, a protective film (not shown) for preventing channeling when performing ion implantation for introducing an impurity into the semiconductor substrate 11 is formed on the semiconductor substrate 11. This protective film is formed by a silicon oxide ($SiO_2$) film, for example. As an example, a method of forming the protective film is carried out by oxidizing the surface of the semiconductor substrate 11.

Next, impurity injection for performing transistor element isolation and threshold value adjustment is performed by ion implantation. After the ion implantation, the silicon oxide ($SiO_2$) film previously formed as the ion implantation protective film is removed to expose the surface of the semiconductor substrate 11.

Next, a dummy gate insulating film 51, a dummy gate 52, and a hard mask 53 are formed in order on the semiconductor substrate 11.

The dummy gate insulating film 51, for example an oxide film is first formed with a thickness of about 1 nm to 3 nm on the semiconductor substrate 11. A dummy gate forming film is next formed on the dummy gate insulating film 51. This dummy gate forming film is formed by depositing polycrystalline silicon (polysilicon) to a thickness of about 100 nm to 200 nm, for example. A chemical vapor deposition (CVD) method, for example, is used as a method of forming the dummy gate forming film. Further, a hard mask layer is formed by a silicon nitride film, for example, on the dummy gate forming film. This silicon nitride film is formed to a thickness of 30 nm to 100 nm, for example, by using a chemical vapor deposition (CVD) method, for example.

Next, a resist film (not shown) for lithography is formed on the hard mask layer. A resist suited to an exposure source is used for the resist film. Then, the resist film is exposed to light to form a dummy gate pattern (not shown), and thereafter, with the dummy gate pattern used as an etching mask, the hard mask layer is etched to form a hard mask 53. Optical lithography using for example KrF, ArF, $F_2$ or the like for a light source or electron beam lithography is used for the light exposure in the above-described lithography. In the etching of the hard mask layer, the hard mask layer can be processed into a line width smaller than that of the pattern of the resist (for example by sliming or trimming) to reduce gate length. Next, the dummy gate pattern formed by the resist film is removed, and with the hard mask 53 formed by the etching process as an etching mask, the dummy gate forming film is processed by dry etching to form a dummy gate 52. The line width of the dummy gate 52 at this time is set at a few nm to a few ten nm. In this etching, the dummy gate insulating film 51 is also etched.

Figure 9B:
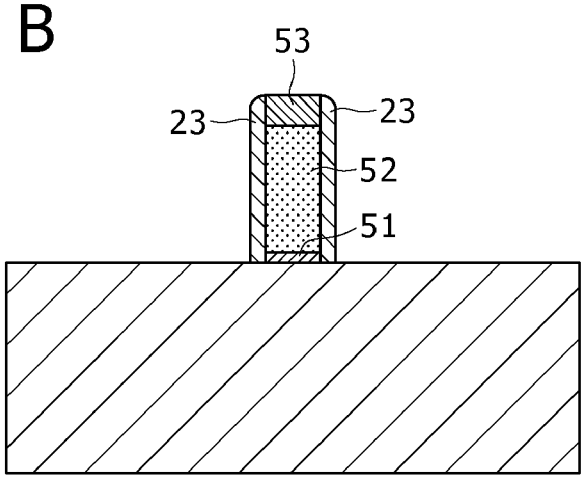

Next, as shown in FIG. 9B, offset spacers 23 are formed on side walls of the dummy gate 52 (a part formed by the dummy gate insulating film 51, the dummy gate 52, and the hard mask 53 will hereinafter be referred to as a dummy gate). The offset spacers 23 are made by forming an insulating thin film of about 1 nm to 10 nm, for example, so as to cover the dummy gate 52, and then etching back the insulating thin film such that the insulating thin film remains only on the side walls of the dummy gate 52. The insulating thin film forming the offset spacers 23 is formed by silicon oxide ($SiO_2$) or silicon nitride (SiN), for example. The insulating thin film on the semiconductor substrate 11 is removed by the above-described etching back.

Figure 9C:
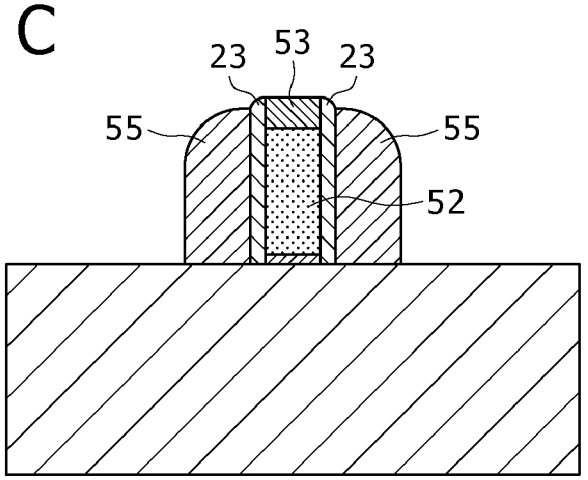

Next, as shown in FIG. 9C, dummy side walls 55 are formed on both sides of the dummy gate 52 with the offset spacers 23 interposed between the dummy side walls 55 and the dummy gate 52. At the time of etching back for forming the dummy side walls 55, the etching is performed such that the hard mask 53 remains.

Figure 9D:
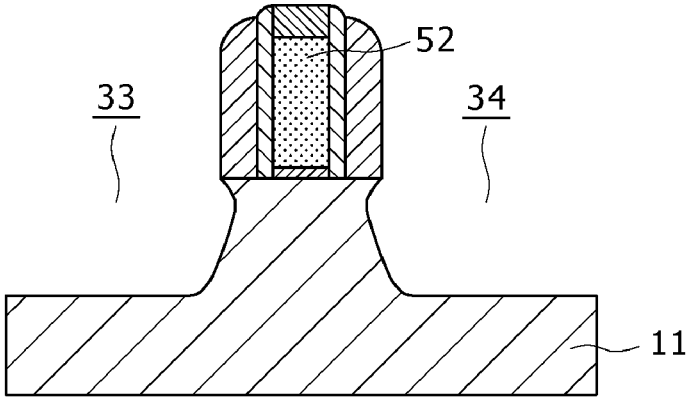

Next, as shown in FIG. 9D, grooves 33 and 34 are formed for source-drain regions 27 and 28 in the semiconductor substrate 11 on both sides of the dummy gate 52. Thereafter, an activation process is performed by rapid thermal annealing (RTA) at about 1000° C., for example.

Figure 9E:
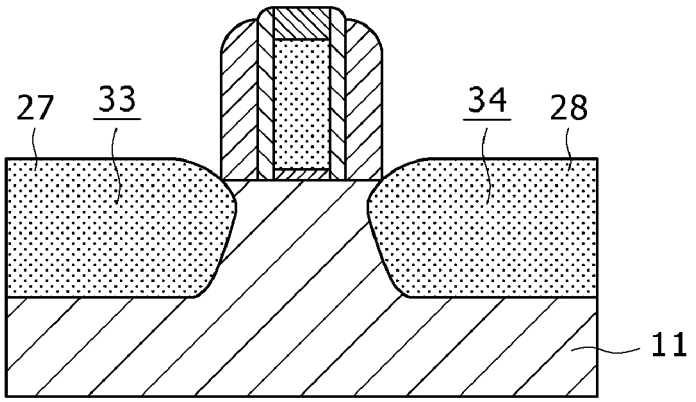

Next, as shown in FIG. 9E, the source-drain regions 27 and 28 are formed by growing a stress applying layer in the grooves 33 and 34 by an epitaxial growth method. For example, when the semiconductor device 2 is a p-type FET (field-effect transistor), the source-drain regions 27 and 28 are formed by a silicon germanium layer grown by epitaxial growth, and apply compressive stress to the channel region 14. As an example of conditions for forming the film, a processing temperature (substrate temperature) is set at 650° C. to 750° C., and the pressure of a growth atmosphere is set at 6.7 kPa to 13.3 kPa. Dichlorosilane ($SiCl_2H_2$: DCS), for example, is used as a silicon raw material gas, and germane ($GeH_4$) is used as a germanium raw material gas. When the semiconductor device 2 is an n-type FET (field-effect transistor), the source-drain regions 27 and 28 are formed by a silicon carbide layer grown by epitaxial growth, and apply tensile stress to the channel region 14. In either case, it is effective to form the source-drain regions 27 and 28 into an embedded source-drain structure raised from the surface of the semiconductor substrate 11.

Figure 9F:
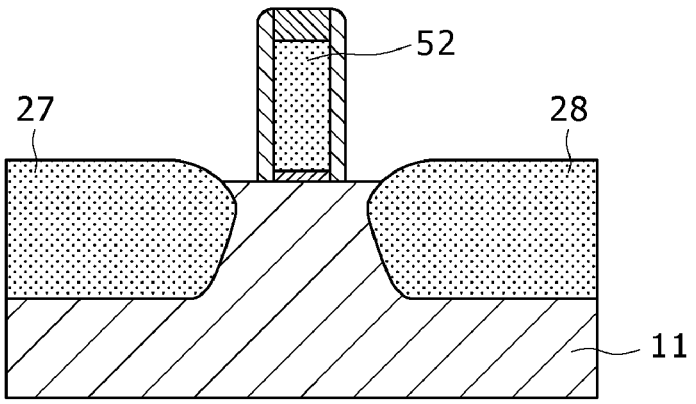

Next, the dummy side walls 55 are removed to expose the semiconductor substrate 11 between the dummy gate 52 and the source-drain regions 27 and 28, as shown in FIG. 9F.

Figure 9G:
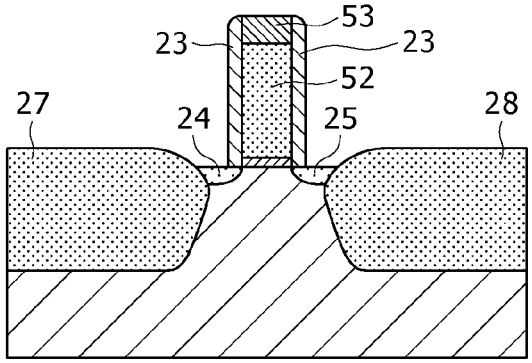

Next, as shown in FIG. 9G, extension regions 24 and 25 are formed in the semiconductor substrate 11 on both sides of the dummy gate 52 with the offset spacers 23 interposed between the extension regions 24 and 25 and the dummy gate 52. The extension regions 24 and 25 are formed by ion implantation, for example. An n-type impurity such as arsenic ($As^+$), phosphorus ($P^+$) or the like is used when an NMOS transistor is formed, for example, and a p-type impurity such as boron ($B^+$), indium ($In^+$) or the like is used when a PMOS transistor is formed. For example, the implantation is performed with a low acceleration energy (100 eV to 300 eV) and a dose of $5\times10^{14}$ (/cm$^2$) to $2\times10^{15}$ (/cm$^2$) whereby the extension regions 24 and 25 are formed with a shallow junction. Thus, the source-drain regions 27 and 28 are formed in the semiconductor substrate 11 on both sides of the dummy gate 52 with the extension regions 24 and 25 interposed between the dummy gate 52 and the source-drain regions 27 and 28.

Figure 9H:
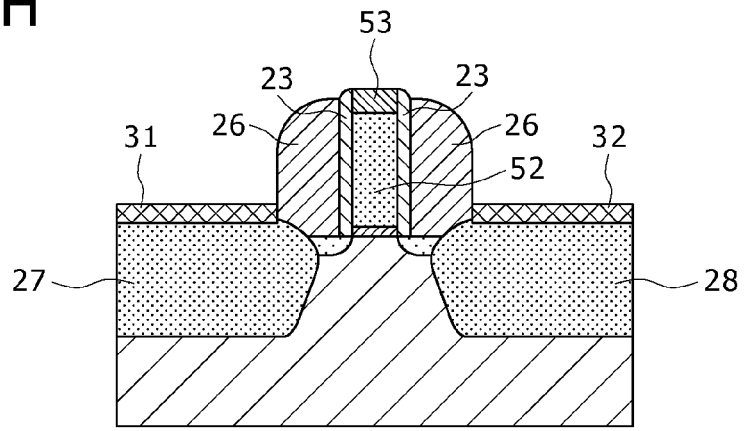

Next, as shown in FIG. 9H, side wall spacers 26 are formed on both sides of the dummy gate 52 with the offset spacers 23 interposed between the side wall spacers 26 and the dummy gate 52. At this time, the side wall spacers 26 cover the surfaces of the extension regions 24 and 25. At the time of etching back for forming the side wall spacers 26, the etching is performed such that the hard mask 53 remains.

Next, resistance lowering layers 31 and 32 are formed on the source-drain regions 27 and 28. The resistance lowering layers 31 and 32 are selectively formed on the surfaces of the source-drain regions 27 and 28 by a salicide process. The resistance lowering layers 31 and 32 are for example formed of cobalt (Co), nickel (Ni), platinum (Pt) or a compound thereof. The compound includes a metal silicide of these metals.

Figure 9I:
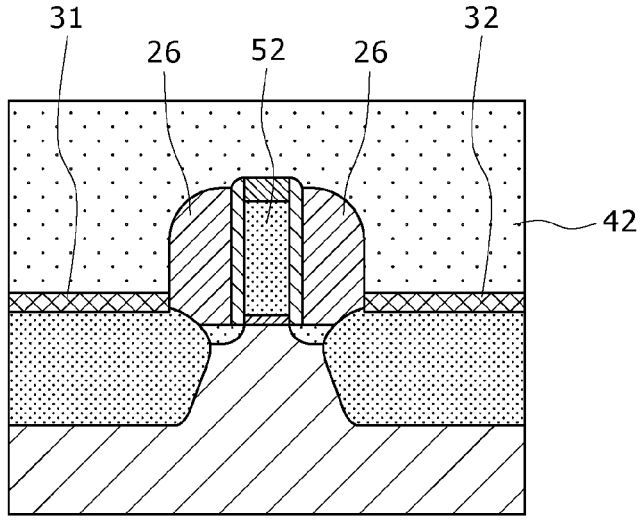

Next, as shown in FIG. 9I, a first interlayer insulating film 42 covering the dummy gate 52, the side wall spacers 26, the resistance lowering layers 31 and 32, and the like is formed.

Figure 9J:
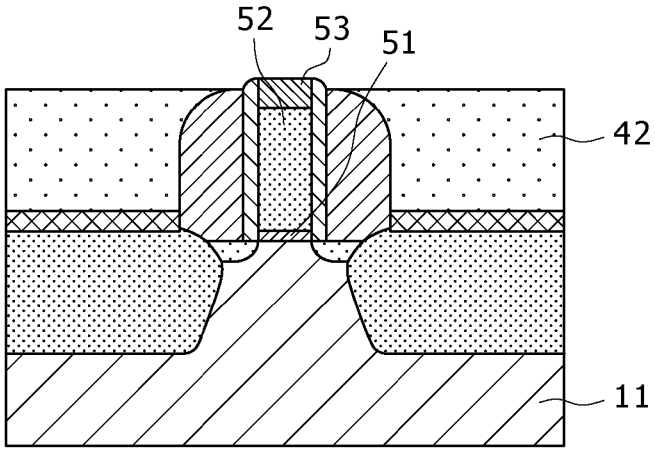

Next, as shown in FIG. 9J, an upper part of the first interlayer insulating film 42 is removed to expose the surface of the hard mask 53. A chemical mechanical polishing (CMP) method, for example, is used to remove the upper part of the first interlayer insulating film 42. Incidentally, another polishing method may be used, and the upper part of the first interlayer insulating film 42 can be removed by etching back. Incidentally, the chemical mechanical polishing method can planarize the polished surface.

Figure 9K:
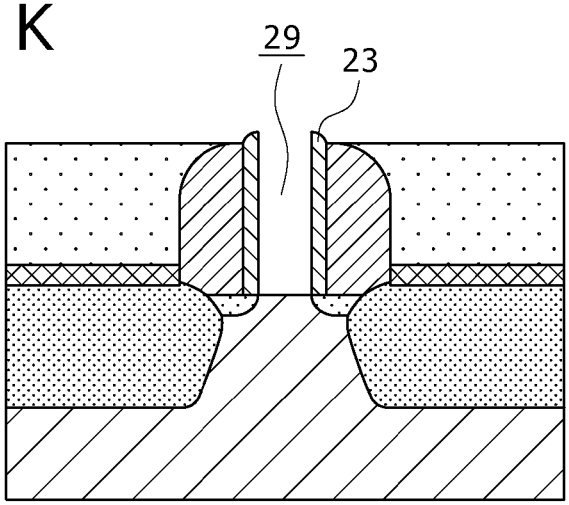

Next, the hard mask 53 and the dummy gate 52 are removed. Dry etching, for example, is used for the removing process. Dry etching damage to the semiconductor substrate 11 is prevented by leaving the dummy gate insulating film 51 in the dry etching. Then the dummy gate insulating film 51 is removed. Wet etching, for example, is used for the removing process. Etching damage to the semiconductor substrate 11 is prevented by performing the removing process by wet etching. As a result, as shown in FIG. 9K, a groove 29 enclosed by the offset spacers 23 is formed. As shown in the sectional view of FIG. 6K in the gate width direction, the channel region 14 formed in the semiconductor substrate 11 directly under the region where the dummy gate 52 is formed is at substantially the same height as the surfaces of the element isolation regions 13. The stress of the element isolation regions 13 is applied to the channel region 14. Thus, the channel region 14 is directly affected by the stress of the element isolation regions 13.

As shown in the sectional view of FIG. 6L in the gate width direction, the above-described wet etching can lower the surfaces of the element isolation regions 13 under the region where the dummy gate 52 was formed by forming depressions 15. Thereby the height of the element isolation regions 13 under the region where the dummy gate 52 was formed can be made lower than that of the surface of the semiconductor substrate 11 (channel region 14). The height of the element isolation regions 13 can be controlled by an amount of wet etching, and an amount of projection of the channel region 14 from the surfaces of the element isolation regions 13 is a height of 3 nm to 30 nm inclusive, for example. The above-described wet etching does not lower the height of the element isolation regions 13 on both sides (in the gate width direction) of the source-drain regions 27 and 28. In addition, the source-drain regions 27 and 28 including the above-described channel region 14 can be maintained at substantially the same height as the semiconductor substrate 11 in another region, for example.

Figure 9L:
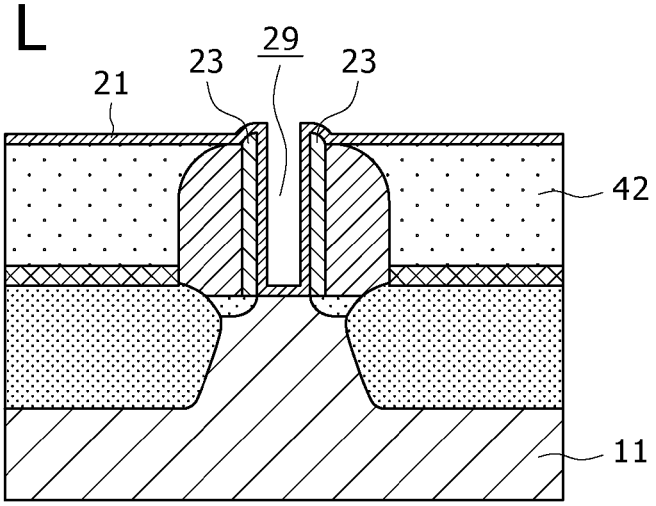

Next, as shown in FIG. 9L, a gate insulating film 21 is formed on the semiconductor substrate 11 within the groove 29. This gate insulating film 21 is actually formed on the inner surfaces of the groove 29 and the surface of the first interlayer insulating film 42. The gate insulating film 21 can be formed by an insulating film such as a high dielectric constant (High-k) film or a silicon oxide film, for example. In this case, the gate insulating film 21 is formed by a high dielectric constant film as an example. In this case, heat treatment (annealing treatment) for modifying the gate insulating film 21 is performed.

Figure 9M:
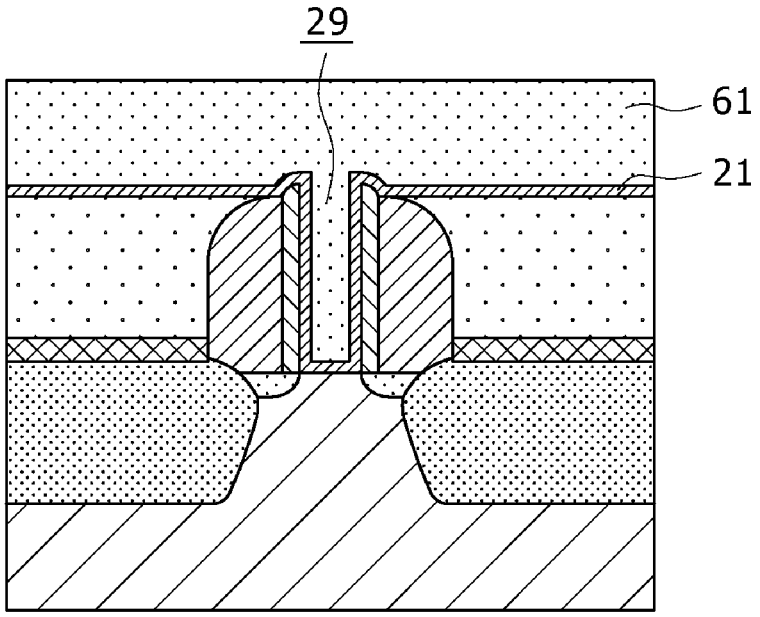

Next, as shown in FIG. 9M, a gate electrode forming film 61 is formed on the gate insulating film 21 in such a manner as to fill the inside of the groove 29. This gate electrode forming film 61 is formed by a laminate of metals or metallic compounds for a metal gate or a single-layer structure, for example.

Figure 9N:
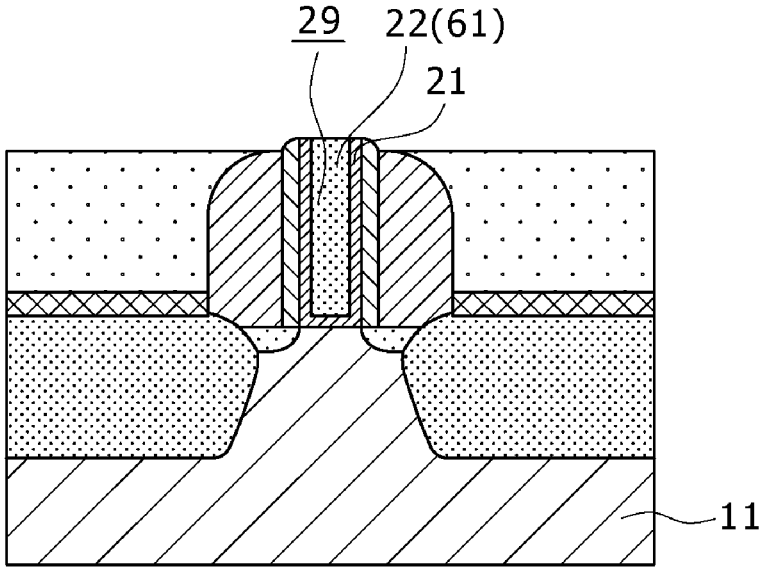

Next, as shown in FIG. 9N, a surplus part of the gate electrode forming film 61 is removed, and a gate electrode 22 is formed by the gate electrode forming film 61 on the semiconductor substrate 11 within the groove 29 with the gate insulating film 21 interposed between the gate electrode 22 and the semiconductor substrate 11. The removing process is performed by a chemical mechanical polishing (CMP) method, for example.

Figure 9O:
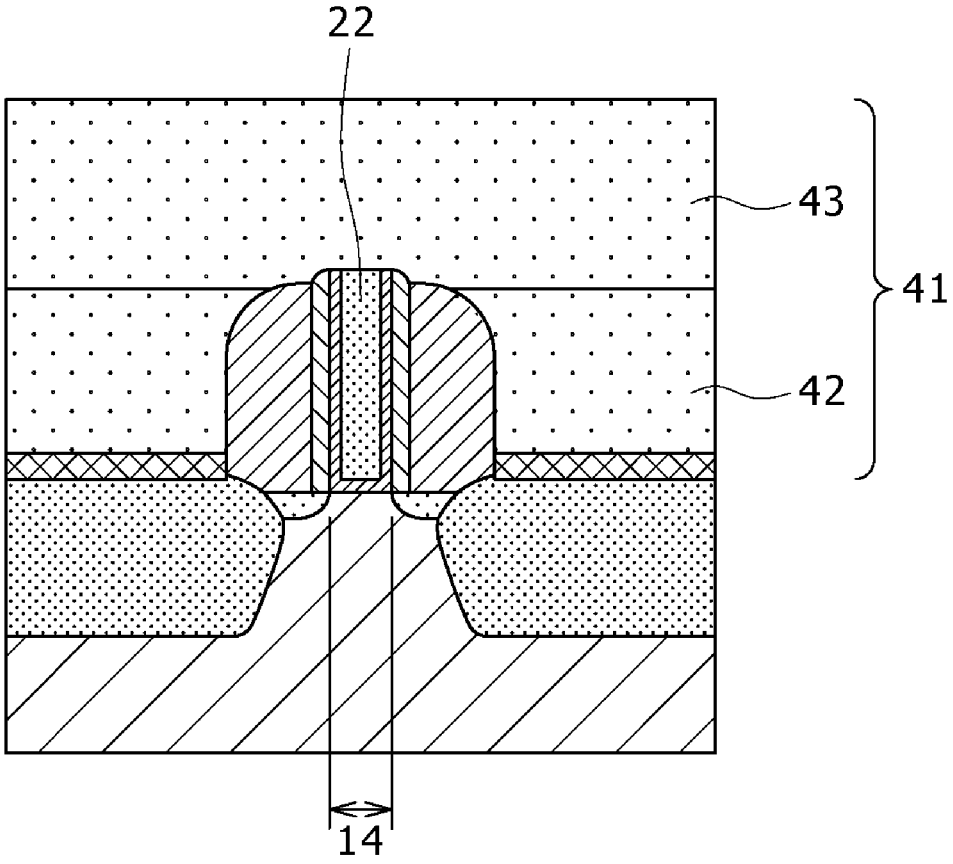

Next, as shown in FIG. 9O, a second interlayer insulating film 43 is formed on the first interlayer insulating film 42 in such a manner as to cover the gate electrode 22. The first interlayer insulating film 42 and the second interlayer insulating film 43 form an interlayer insulating film 41. Stress in the channel region 14 at this time is maintained in a stress state that occurred when removing the top parts of the element isolation regions 13 under the region where the dummy gate 52 (see FIG. 9J described above) had been formed.

Though not shown, contact parts electrically connected to the respective source-drain regions 27 and 28, metallic wiring routed to the contact parts, and the like are thereafter formed in the interlayer insulating film 41. The semiconductor device is thereby completed.

The above-described semiconductor device manufacturing method provides similar actions and effects to those of the first embodiment of the semiconductor device manufacturing method, and applies stress effective to improve mobility also from the source-drain regions 27 and 28 to the channel region 14. The semiconductor device 2 therefore improves mobility more than the semiconductor device formed by the semiconductor device manufacturing method according to the first embodiment.

In addition, in each of the foregoing embodiments, a film having stress can be used for the gate electrode 22. For example, when applied to the gate electrode 22, in the case of an n-type MOSFET (field-effect transistor), hafnium, hafnium silicide, tantalum, tantalum silicide or the like may be used to apply tensile stress in the gate length direction of the channel region 14. In the case of a p-type MOSFET (field-effect transistor), titanium, titanium nitride, ruthenium, tungsten or the like may be used to apply compressive stress to the channel region 14. The use of such films can further improve mobility.

It should be understood by those skilled in the art that various modifications, combinations, sub-combinations and alterations may occur depending on design requirements and other factors insofar as they are within the scope of the appended claims or the equivalents thereof.

What is claimed is:

[1. A semiconductor device comprising:

semiconductor substrate with an element formation region projecting from a base portion of said substrate and extending in a first direction along said base portion;

element isolation regions buried in said semiconductor substrate such that said element formation region of said semiconductor substrate is flanked by said element isolation regions, said element isolation regions having upper surfaces;

a gate electrode on said element formation region with a gate insulating film interposed between said gate electrode and said element formation region, said gate electrode crossing said element formation region in a second direction; and source-drain regions formed in said element formation region on both sides of said gate electrode, wherein, said element formation region includes a channel region under said gate electrode, said source-drain regions are positioned within said element formation region so as to extend below said upper surfaces of said element isolation regions, said element isolation regions include depressions in said upper surfaces which extend in said second direction and which flank said channel region, said gate electrode extends into said depressions in said upper surfaces of said element isolation regions and has an upper surface positioned above bottom surfaces of said depressions, and said channel region has an upper surface positioned above said bottom surfaces of said depressions.]

[2. The semiconductor device according to claim 1, wherein surfaces of said source-drain regions are at one of a position equal in height to a surface of said semiconductor substrate and a position higher than the surface of said semiconductor substrate.]

[3. The semiconductor device according to claim 1, comprising a stress applying film which applies stress to said channel region.]

[4. The semiconductor device according to claim 1, comprising a stress applying insulating film covering said gate electrode which applies stress to said channel region.]

[5. The semiconductor device of claim 1, further comprising a silicide layer on said element formation region.]

[6. The semiconductor device of claim 1, wherein a difference between said channel region and said bottom surfaces of said depressions is from 3 nm to 30 nm, inclusive.]

[7. The semiconductor device of claim 1, wherein said element formation region includes SiGe regions in which said source and drain are located.]

[8. The semiconductor device of claim 3, wherein said stress applying layer is an SiN film.]

[9. The semiconductor device of claim 4, wherein said stress applying layer is an SiN film.]

*10. A semiconductor device comprising:*

*a semiconductor substrate having:*

*an element formation region that, in a perspective view of the semiconductor device, extends in a first direction and a second direction, wherein a first extension of the element formation region in the first direction is greater than a second extension of the element formation region in the second direction,*

*a silicon channel region of the element formation region, and*

*silicon germanium source-drain regions of the element formation region;*

*a gate electrode configured to extend, in the perspective view, along the first direction and the second direction, wherein a first extension of the gate electrode in the first direction is less than a second extension of the gate electrode in the second direction, so that:*

*the element formation region crosses the gate electrode,*

*the gate electrode is on the element formation region, and*

*the silicon channel region is between the silicon germanium source-drain regions and under the gate electrode;*

*element isolation regions that, in the perspective view, are:*

*buried in the semiconductor substrate, and*

*between the gate electrode and the semiconductor substrate; and*

*a gate insulating film that, in a vertical sectional view of the semiconductor device, is:*

*between the gate electrode and the silicon channel region, and*

*between the gate electrode and the element isolation regions,*

*wherein:*

*the first direction is orthogonal to the second direction,*

*the element formation region protrudes from a base portion of the semiconductor substrate so that the element formation region, in the vertical sectional view, is between the element isolation regions,*

*the silicon germanium source-drain regions are on both sides of the gate electrode and extend below upper surfaces of the element isolation regions,*

*depressions into the upper surfaces of the element isolation regions flank the silicon channel region,*

*the gate electrode extends into the depressions so that, in the vertical sectional view, an upper surface of the gate electrode is above bottom surfaces of the depressions, and*

*junction positions of the silicon germanium source-drain regions are deeper than surfaces of the element isolation regions.*

*11. The semiconductor device of claim 10, wherein the element isolation regions are formed of an insulating thin film.*

*12. The semiconductor device of claim 10, wherein the semiconductor substrate is silicon.*

*13. The semiconductor device of claim 10, wherein surfaces of the silicon germanium source-drain regions are at one of a position equal in height to a surface of the semiconductor substrate and a position higher than the surface of the semiconductor substrate.*

*14. The semiconductor device of claim 10, further comprising:*

*a stress applying film that is configured to apply stress to the silicon channel region.*

*15. The semiconductor device of claim 14, wherein the stress applying film is an SiN film.*

*16. The semiconductor device of claim 10, further comprising:*

*a stress applying insulating film covering the gate electrode in a manner that applies stress to the silicon channel region.*

*17. The semiconductor device of claim 16, wherein the stress applying insulating film is an SiN film.*

*18. The semiconductor device of claim 10, further comprising:*

*a silicide layer on the element formation region.*

*19. The semiconductor device of claim 10, wherein a difference between the silicon channel region and the bottom surfaces of the depressions is from 3 nm to 30 nm, inclusive.*

*20. The semiconductor device of claim 10, wherein an upper surface of the silicon channel region, in the vertical sectional view, is above the bottom surfaces of the depressions.*

* * * * *